(12) United States Patent
Kurokawa et al.

(10) Patent No.: US 8,330,887 B2
(45) Date of Patent: Dec. 11, 2012

(54) LIQUID CRYSTAL DISPLAY DEVICE AND ELECTRONIC DEVICE

(75) Inventors: Yoshiyuki Kurokawa, Sagamihara (JP); Takayuki Ikeda, Atsugi (JP); Takeshi Osada, Isehara (JP); Takayuki Inoue, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 198 days.

(21) Appl. No.: 12/219,020

(22) Filed: Jul. 15, 2008

(65) Prior Publication Data

US 2009/0027580 A1 Jan. 29, 2009

(30) Foreign Application Priority Data

Jul. 27, 2007 (JP) .................................. 2007-196489

(51) Int. Cl.
*G02F 1/136* (2006.01)
(52) U.S. Cl. ......................................................... 349/43
(58) Field of Classification Search .................... 349/43
See application file for complete search history.

(56) References Cited

U.S. PATENT DOCUMENTS

| | | | |
|---|---|---|---|
| 4,409,134 A | 10/1983 | Yamazaki |
| 4,723,838 A | 2/1988 | Aoki et al. |
| 5,084,777 A | 1/1992 | Slobodin |
| 5,200,846 A | 4/1993 | Hiroki et al. |
| 5,453,858 A | 9/1995 | Yamazaki |
| 5,591,987 A | 1/1997 | Yamazaki et al. |
| 5,648,662 A | 7/1997 | Zhang et al. |
| 5,701,167 A | 12/1997 | Yamazaki |
| 5,766,989 A | 6/1998 | Maegawa et al. |
| 5,811,328 A | 9/1998 | Zhang et al. |
| 5,815,226 A | 9/1998 | Yamazaki et al. |
| 5,825,050 A | 10/1998 | Hirakawa |
| 5,849,601 A | 12/1998 | Yamazaki |
| 5,894,151 A | 4/1999 | Yamazaki et al. |
| 6,023,075 A | 2/2000 | Yamazaki |
| 6,118,506 A | 9/2000 | Yamazaki et al. |
| 6,124,155 A | 9/2000 | Zhang et al. |

(Continued)

FOREIGN PATENT DOCUMENTS

CN 1873933 12/2006

(Continued)

OTHER PUBLICATIONS

Arai et al., "41.2: Micro Silicon Technology for Active Matrix OLED Display," SID Digest '07: SID International Symposium Digest of Technical Papers, 2007, pp. 1370-1373.

(Continued)

*Primary Examiner* — Jerry Blevins
(74) *Attorney, Agent, or Firm* — Eric J. Robinson; Robinson Intellectual Property Law Office, P.C.

(57) ABSTRACT

It is an object to provide a liquid crystal display device and an electronic device of which aperture ratio increases. The present invention includes a substrate having an insulating surface, a transistor formed over the substrate, a pixel electrode electrically connected to the transistor. The transistor includes a gate electrode, a gate insulating layer over the gate electrode, a semiconductor layer having a microcrystalline structure over the gate insulating layer, and a buffer layer over the semiconductor layer having the microcrystalline structure. The channel width W of the transistor and the channel length L of the transistor satisfy a relation of $0.1 \leq W/L \leq 1.7$.

20 Claims, 23 Drawing Sheets

U.S. PATENT DOCUMENTS

| | | | |
|---|---|---|---|
| 6,166,399 | A | 12/2000 | Zhang et al. |
| 6,252,249 | B1 | 6/2001 | Yamazaki |
| 6,306,213 | B1 | 10/2001 | Yamazaki |
| 6,335,213 | B1 | 1/2002 | Zhang et al. |
| 6,525,341 | B1 | 2/2003 | Tsujimura et al. |
| 6,756,258 | B2 | 6/2004 | Zhang et al. |
| 6,797,548 | B2 | 9/2004 | Zhang et al. |
| 6,847,064 | B2 | 1/2005 | Zhang et al. |
| 6,879,110 | B2 | 4/2005 | Koyama |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,608,490 | B2 | 10/2009 | Yamazaki et al. |
| 7,738,050 | B2 | 6/2010 | Yamazaki et al. |
| 7,897,971 | B2 | 3/2011 | Kurokawa et al. |
| 7,998,800 | B2 | 8/2011 | Yamazaki |
| 8,093,112 | B2 | 1/2012 | Miyairi et al. |
| 2001/0038098 | A1 | 11/2001 | Yamazaki et al. |
| 2002/0008819 | A1 | 1/2002 | Yoshida |
| 2003/0137613 | A1* | 7/2003 | Katayama ............... 349/43 |
| 2004/0125252 | A1* | 7/2004 | Lee et al. ............... 349/43 |
| 2004/0188685 | A1 | 9/2004 | Lin et al. |
| 2005/0012097 | A1 | 1/2005 | Yamazaki |
| 2005/0017243 | A1 | 1/2005 | Zhang et al. |
| 2006/0125972 | A1* | 6/2006 | Shyu ............... 349/43 |
| 2006/0148216 | A1 | 7/2006 | Takayama et al. |
| 2006/0275710 | A1* | 12/2006 | Yamazaki et al. ........ 430/313 |
| 2007/0004109 | A1 | 1/2007 | Ichijo et al. |
| 2007/0018165 | A1 | 1/2007 | Yamazaki |
| 2007/0146566 | A1 | 6/2007 | Hosoya |
| 2007/0228452 | A1* | 10/2007 | Asami ............... 257/315 |
| 2008/0008905 | A1* | 1/2008 | Yamazaki ............... 428/690 |
| 2008/0044962 | A1 | 2/2008 | Zhang et al. |
| 2008/0078999 | A1* | 4/2008 | Lai ............... 257/59 |
| 2008/0099826 | A1 | 5/2008 | Lai et al. |
| 2008/0182368 | A1 | 7/2008 | Kunii |
| 2008/0284709 | A1 | 11/2008 | Yamazaki |
| 2008/0299689 | A1 | 12/2008 | Yamazaki |
| 2008/0308807 | A1 | 12/2008 | Yamazaki et al. |
| 2009/0001375 | A1 | 1/2009 | Yamazaki et al. |
| 2009/0002591 | A1 | 1/2009 | Yamazaki et al. |
| 2009/0008645 | A1 | 1/2009 | Yamazaki et al. |
| 2009/0020759 | A1 | 1/2009 | Yamazaki |
| 2009/0021664 | A1 | 1/2009 | Yamazaki |
| 2009/0023236 | A1 | 1/2009 | Miyairi et al. |
| 2011/0287592 | A1 | 11/2011 | Yamazaki |

FOREIGN PATENT DOCUMENTS

| | | | |
|---|---|---|---|
| EP | 0473988 | A | 3/1992 |
| EP | 1037093 | | 9/2000 |
| JP | 60-098680 | A | 6/1985 |
| JP | 61-087371 | A | 5/1986 |
| JP | 04-242724 | A | 8/1992 |
| JP | 10-170961 | | 6/1998 |
| JP | 11-121761 | A | 4/1999 |
| JP | 2001-127296 | A | 5/2001 |
| JP | 2002-246605 | A | 8/2002 |
| JP | 2005-049832 | A | 2/2005 |
| JP | 2005-167051 | A | 6/2005 |
| JP | 2007-005508 | A | 1/2007 |
| JP | 2007-035964 | A | 2/2007 |

OTHER PUBLICATIONS

Chinese Office Action (Application No. 200810130136.9) Dated May 25, 2011.

Lee.C et al., "How to Achieve High Mobility Thin Film Transistors by Direct Deposition of Silicon Using 13.56 MHz RF PECVD?,", IEDM 06: Technical Digest of International Electron Devices Meeting, Dec. 11, 2006, pp. 295-298.

Lee.C et al., "Directly Deposited Nanocrystalline Silicon Thin-Film Transistors with Ultra High Mobilities,", Appl. Phys. Lett. (Applied Physics Letters), Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for Amoled Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Esmaeili-Rad. M et al., "Absence of Defect State Creation in Nanocrystalline Silicon Thin Film Transistors Deduced From Constant Current Stress Measurements,", Appl. Phys. Lett. (Applied Physics Letters), Sep. 12, 2007, vol. 91, No. 11, pp. 113511-1-113511-3.

Lee.C et al., "Stability of NC-SILH TFTS With Silicon Nitride Gate Dielectric,", IEEE Transactions on Electron Devices, Jan. 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Esmaeili-Rad.M et al., "Stability of Nanocrystalline Silicon Bottom-Gate Thin Film Transistors With Silicon Nitride Gate Dielectric,", J. Appl. Phys. (Journal of Applied Physics), Sep. 28, 2007, vol. 102, No. 6, pp. 064512-1-064512-7.

Lee.C et al., "Top-Gate TFTS Using 13.56MHz PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75°C Hydrogenated Nanocrystalline Silicon Plasma-Enhanced Chemical Vapor Deposition Films,", J. Appl. Phys. (Journal of Applied Physics), Aug. 4, 2005, vol. 98, No. 3, pp. 034305-1-034305-7.

* cited by examiner

LIQUID CRYSTAL DISPLAY DEVICE AND ELECTRONIC DEVICE

BACKGROUND OF THE INVENTION

1. Field of the Invention

The present invention relates to a liquid crystal display device and an electronic device.

2. Description of the Related Art

In recent years, techniques for manufacturing semiconductor devices using a semiconductor thin film which is formed over a substrate having an insulating surface have been researched. Semiconductor devices using the above-mentioned semiconductor thin film are widely used, and in particular, are often used as switching elements for image display devices.

As a switching element of the image display device, an amorphous semiconductor or a polycrystalline semiconductor is used. In the case of using the amorphous semiconductor, since the number of the steps can be reduced by eliminating the steps necessary for crystallization or the like, there is an advantage that the switching element can be manufactured with low cost. In the case of using the polycrystalline semiconductor, there is an advantage that high functional switching element can be manufactured.

Examples of the image display device using the switching element include a liquid crystal display device or an electroluminescence display device. Liquid crystal display device is a device which performs display by changing an orientation of liquid crystal molecules due to applying the potential difference between a pixel electrode and a counter electrode. Note that a storage capacitor is generally provided in a pixel in order to hold the potential difference which is necessary for display for a certain period. An electroluminescence display device performs display in such a manner that electric charges are supplied to a light-emitting material provided between electrodes and radiative recombination of carriers is derived.

In liquid crystal display device, the aperture ratio of a pixel is one of the important parameters for determining display quality. The luminance increases by improving the aperture ratio, whereby display of high contrast is realized. In addition, the output of a backlight can be reduced by improving the aperture ratio. A method of improving aperture ratio includes, for example, a method in which a storage capacitor is formed using a light shielding film (for example, Reference 1: Japanese Published Patent Application No. H10-170961).

In the meantime, as a semiconductor material, there is a microcrystalline semiconductor as well as an amorphous semiconductor and a polycrystalline semiconductor. For example, the microcrystalline silicon is known materials for a long time as well as the amorphous silicon. History of a field effect transistor using the microcrystalline silicon can go back to 1980's (For example, Reference 2: U.S. Pat. No. 5,591,987). However, a transistor using the microcrystalline silicon has lagged behind a transistor using the amorphous silicon and a transistor using the polycrystalline silicon in practical application till now, and reports are found only in academic conferences and so on (for example, Reference 3: Toshiaki Arai et al., SID 07 DIGEST, 2007, pp. 1370-1373).

SUMMARY OF THE INVENTION

In a liquid crystal display device, high current drive capability and low leakage current characteristics are needed for a transistor of a pixel portion (hereinafter, also referred to as a "pixel transistor"). High current drive capability is needed in order to perform charging or discharging of a storage capacitor in a rapid manner. Low leakage current characteristics are needed in order to save electric charges stored in a storage capacitor.

When the amorphous semiconductor is used as a pixel transistor, there is an advantage that manufacturing cost is low. On the other hand, since the amorphous semiconductor has low carrier mobility, current drive capability of a transistor using the amorphous semiconductor is also low. Improvement of current drive capability is possible by increase of the channel width of a transistor. However, the size of the transistor increases in this case, whereby a problem of decreasing the aperture ratio of a pixel is caused.

When the transistor size increases, another adverse effect occurs. For example, the problem is that a capacitor (hereinafter, also referred to as a coupling capacitor) formed between a source region or a drain region of a transistor and a gate wiring (also referred to as a gate electrode) becomes large. As shown in FIG. 23, the circuit diagram illustrates the state in which a coupling capacitor 2301 and a storage capacitor 2302 are connected in series between a gate wiring 2303 and a liquid crystal element 2304. In other words, when the potential of the gate wiring 2303 fluctuates, the potential of the storage capacitor 2302 also fluctuates. For the constant display quality, it is necessary that the fluctuation in potential of the storage capacitor 2302 is enough small and that a ratio of the storage capacitor 2302 to the coupling capacitor 2301 are increased. However, when the storage capacitor 2302 becomes large, the aperture ratio decreases. In addition, increasing of the transistor size causes increasing of the coupling capacitor 2305 concurrently, whereby rounding of a source signal or the like becomes a problem.

Thus, it is difficult to increase the aperture ratio with keeping desired performance in the case of using the amorphous semiconductor as a pixel transistor.

On the other hand, when the polycrystalline semiconductor is used as a pixel transistor, the problem due to low mobility is solved. However, resolution of an exposure apparatus used for manufacturing a liquid crystal display device is about several μm. Thus, advantageous characteristics of the polycrystalline semiconductor are hardly utilized. On the contrary, a problem of increasing of leakage current occurs due to increasing of the channel width than the suitable size. The storage capacitor is needed to be large when the leakage current is much, whereby the aperture ratio decreases. Further, countermeasures such as some transistors are connected in series are taken in order to decrease the leakage current in some case. However, the aperture ratio decreases also in this case. Note that resolution is low compared to the case of LSI or the like because a substrate used for the liquid crystal display device (typically, a glass substrate) has several tens of μm distortion. Thus, depth of focus of the exposure apparatus has to be deep in the case of exposing entire of large area.

Moreover, when the polycrystalline semiconductor is used, problems that a process flow becomes complicated and decrease of productivity occur.

In view of such problems, it is an object of the present invention to provide a liquid crystal display device and an electronic device with improved aperture ratio.

In the present invention, a transistor is manufactured using a stacked structure of semiconductor having a microcrystalline structure (hereinafter also referred to as "microcrystalline semiconductor") and an amorphous semiconductor. More specifically, a bottom gate thin film transistor is manufactured having a structure in which an amorphous semiconductor is stacked over the microcrystalline semiconductor using the microcrystalline semiconductor as the channel formation region. Thus, a transistor which has high current drive capability and low leakage current characteristics can be provided. That is, the liquid crystal display device with improved aperture ratio can be provided by using the above-mentioned transistor as a switching element.

One aspect of the present invention is a liquid crystal display device including a substrate having an insulating surface, a transistor formed over the substrate, and a pixel electrode electrically connected to the transistor. The transistor includes a gate electrode, a gate insulating layer over the gate electrode, a semiconductor layer having a microcrystalline structure over the gate insulating layer, and a buffer layer over the semiconductor layer having the microcrystalline structure. A channel width W of the transistor and a channel length L of the transistor satisfy a relation of $0.1 \leq W/L \leq 1.7$.

Another aspect of the present invention is a liquid crystal display including a substrate having an insulating surface, a transistor formed over the substrate, and a pixel electrode electrically connected to the transistor. The transistor includes a gate electrode, a gate insulating layer over the gate electrode, a semiconductor layer having a microcrystalline structure over the gate insulating layer, and a buffer layer over the semiconductor layer having the microcrystalline structure. A channel width W of the transistor is equal to or greater than 1 μm and equal to or less than 10 μm (more preferably equal to or greater than 1 μm and equal to or less than 5 μm).

Another aspect of the present invention is a liquid crystal display including a substrate having an insulating surface, a transistor formed over the substrate, and a pixel electrode electrically connected to the transistor. The transistor includes a gate electrode, a gate insulating layer over the gate electrode, a semiconductor layer having a microcrystalline structure over the gate insulating layer, and a buffer layer over the semiconductor layer having the microcrystalline structure. A channel width W of the transistor and a channel width $W_a$ of a transistor which is manufactured to have equal current drive capability by using the smallest processing dimension (d) and an amorphous semiconductor satisfy the relation of $d \leq W \leq W_a$. Note that in the above description, a parameter except for the channel width ($W_a$) is equal to the transistor of the present invention.

Another aspect of the liquid crystal display device of the present invention includes a substrate having an insulating surface, a transistor formed over the substrate, and a pixel electrode electrically connected to the transistor. The transistor includes a gate electrode, a gate insulating layer over the gate electrode, a semiconductor layer having a microcrystalline structure over the gate insulating layer, and a buffer layer over the semiconductor layer having the microcrystalline structure. A channel width W of the transistor and a channel length L of the transistor satisfy a relation of $0.1 \leq W/L \leq 1.7$. The buffer layer is left at least over the semiconductor layer having the microcrystalline structure which is a channel formation region of the transistor.

Another aspect of a liquid crystal display device of the present invention includes a substrate having an insulating surface, a transistor formed over the substrate, and a pixel electrode electrically connected to the transistor. The transistor includes a gate electrode, a gate insulating layer over the gate electrode, a semiconductor layer having a microcrystalline structure over the gate insulating layer, and a buffer layer over the semiconductor layer having the microcrystalline structure. A channel width W of the transistor is equal to or greater than 1 μm and equal to or less than 10 μm (preferably greater than 1 μm and equal to or less than 5 μm). The buffer layer is left at least over the semiconductor layer having the microcrystalline structure which is a channel formation region of the transistor.

Another aspect of the present invention is a liquid crystal display including a substrate having an insulating surface, a transistor formed over the substrate, and a pixel electrode electrically connected to the transistor. The transistor includes a gate electrode, a gate insulating layer over the gate electrode, a semiconductor layer having a microcrystalline structure over the gate insulating layer, and a buffer layer over the semiconductor layer having the microcrystalline structure. A channel width W of the transistor and a channel width $W_a$ of a transistor which is manufactured to have equal current drive capability by using the smallest processing dimension (d) and an amorphous semiconductor satisfy the relation of $d \leq W \leq W_a$. The buffer layer is left at least over the semiconductor layer having the microcrystalline structure which is a channel formation region of the transistor. Note that in the above description, a parameter except for the channel width ($W_a$) is equal to the transistor of the present invention.

In the above-mentioned structure, the buffer layer is formed using an amorphous semiconductor. A groove is formed in the buffer layer over the semiconductor layer having the microcrystalline structure which is a channel formation region of the transistor.

Further, various electronic devices can be provided using the above-described liquid crystal display devices.

Note that, in this specification, a microcrystalline semiconductor means a semiconductor having a microcrystalline structure unless otherwise noted. That is, a structure other than a microcrystalline structure may be included as a component of the microcrystalline semiconductor. For example, an amorphous structure can be included in some cases depending on film formation conditions.

Note that in this specification, "connection" includes "electric connection".

A display device in this specification includes a display device such as an image display device, a light source such as a lighting unit, or the like. Further, the display device includes any of the following modules: a module in which a connector such as a flexible printed circuit (FPC), tape automated bonding (TAB) tape, or a tape carrier package (TCP) is attached to a display device; a module having TAB tape or a TCP provided with a printed wiring board at the end thereof; and a module having an integrated circuit (IC) mounted on a display element by a chip on glass (COG) method.

By the present invention, a liquid crystal display device with improved aperture ratio can be provided. High quality electronic devices can be provided by using this.

DETAILED DESCRIPTION OF THE INVENTION

Figure 1A:
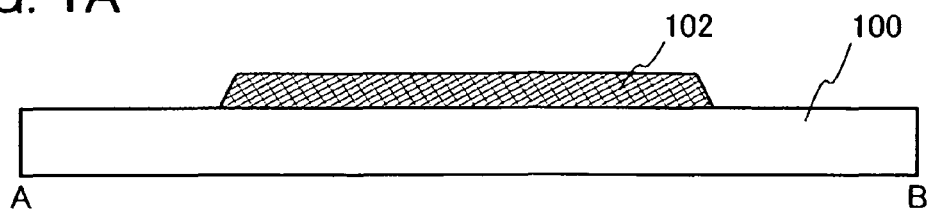
FIGS. 1A to 1E illustrate a manufacturing process of a display device of the present invention.

Embodiment Mode of the present invention will be explained below with reference to the accompanying drawings. However, it is easily understood by those skilled in the art that the invention is not limited by the following descriptions and various changes may be made in forms and details without departing from the spirit and the scope of the invention. The present invention should not be interpreted as being limited to the description of the embodiment modes to be given below. Note that in a structure of the present invention, which will be described below, the same reference numerals are used for the same portions or portions having the same functions in different drawings.

Embodiment Mode 1

In this embodiment mode, a manufacturing process of a liquid crystal display device of the present invention, in particular, a manufacturing process of the thin film transistor is described with reference to FIGS. 1A to 1E, FIGS. 2A to 2C, FIGS. 3A to 3C, FIGS. 4A to 4D, FIGS. 5A to 5D, and FIGS. 6A and 6B. FIGS. 1A to 1E, FIGS. 2A to 2C, and FIGS. 3A to 3C are cross-sectional views of the manufacturing process. FIGS. 4A to 4D and FIGS. 5A to 5D are plan views of a connection region of the thin film transistor and a pixel electrode in one pixel. FIGS. 6A and 6B are a plan view and a cross-sectional view of a completed liquid crystal display device.

Note that various structures can be considered as a plan view structure. This embodiment mode describes typical structures, in which a channel formation region, a source region, and a drain region are arranged linearly (see FIGS. 4A to 4D), and in which a channel formation region and one of a source region and a drain region form a U-shaped structure (see FIGS. 5A to 5D). Of course, the present invention is not limited to those structures. A structure like FIG. 5A to 5D is preferable because a certain width of a channel can be obtained without decrease of aperture ratio. Since the channel width can be adequately small in the present invention, a liquid crystal display device with extremely high aperture ratio can be manufactured using a linear structure like FIGS. 4A to 4D. Note that cross-sectional views of FIGS. 1A to 1E, FIGS. 2A to 2C, and FIGS. 3A to 3C correspond to lines A-B in FIGS. 4A to 4D and FIGS. 5A to 5D.

In a thin film transistor using a microcrystalline semiconductor, an n-channel transistor has higher current drive capability than that of a p-channel transistor. Thus, an n-channel transistor is suitable for a transistor of a pixel portion; however, the present invention is not limited to this. In this embodiment mode, description is made using an n-channel thin film transistor.

Figure 4A:
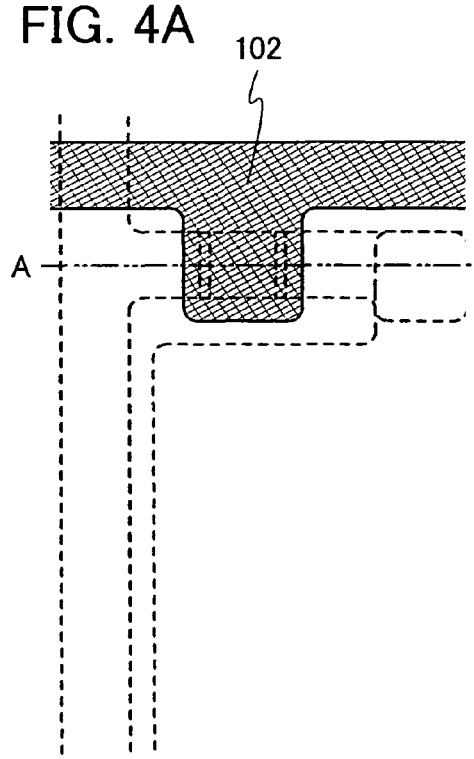
FIGS. 4A to 4D are plan views of a display device of the invention.
Figure 4B:
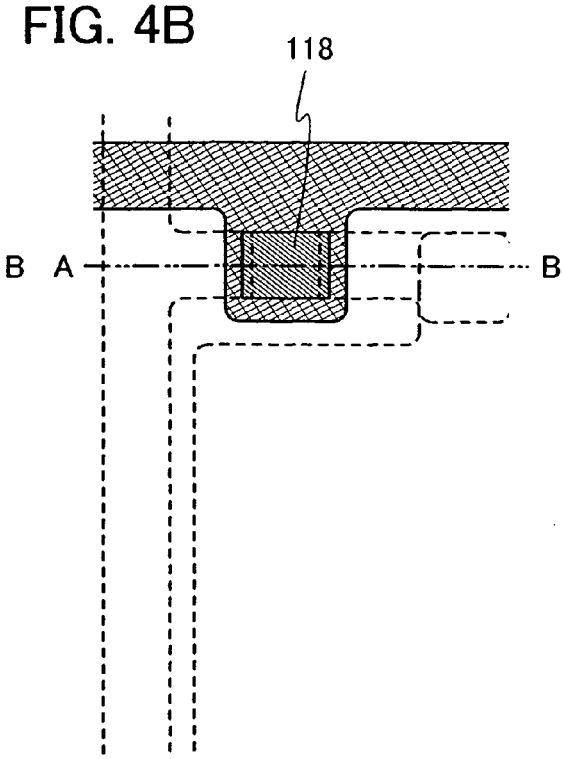
Figure 5A:
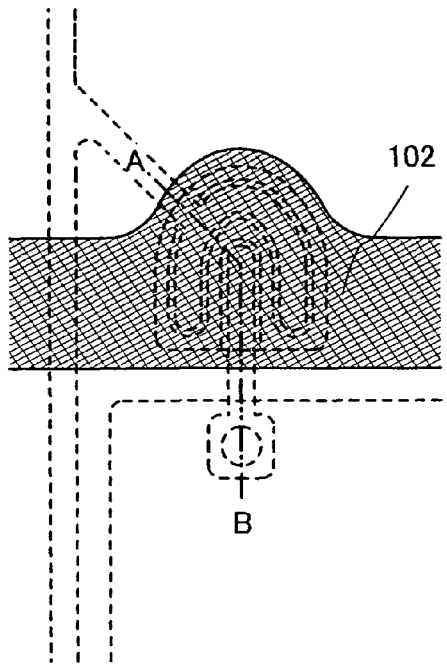
FIGS. 5A to 5D are plan views of a display device of the invention.
Figure 5B:
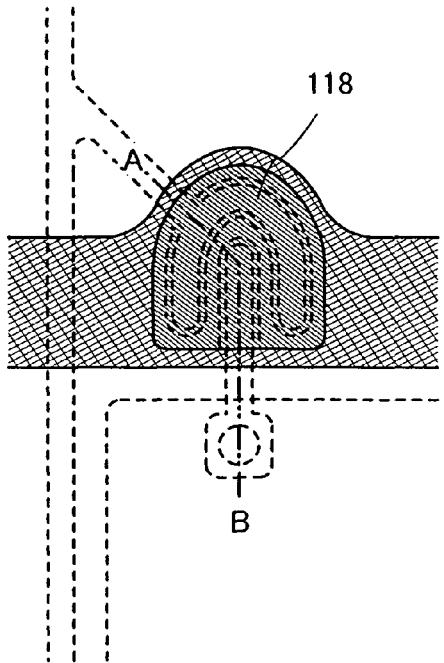
Figure 6A:
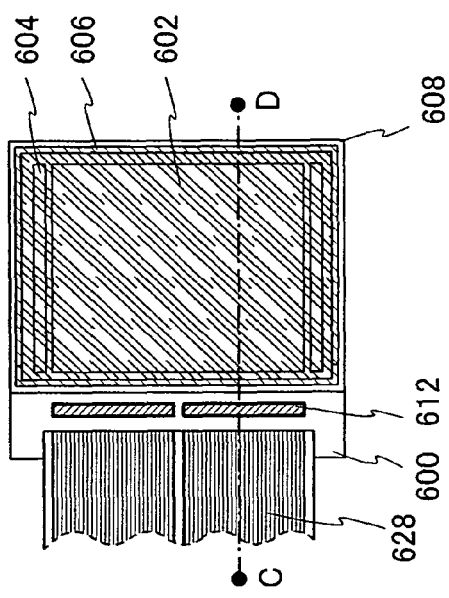
FIGS. 6A and 6B illustrate an example of a display device of the present invention.
Figure 6B:
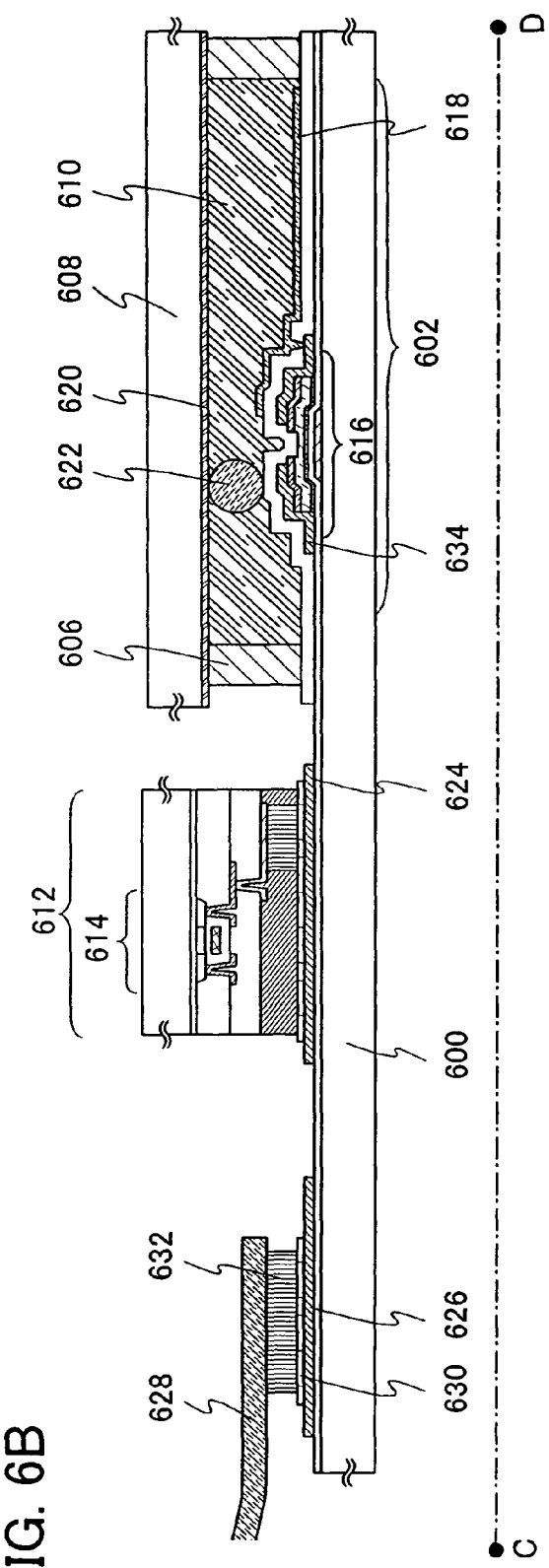

First, a gate electrode 102 is formed over a substrate 100 (see FIG. 1A, FIG. 4A, and FIG. 5A). As the substrate 100, any of the following substrates can be used: non-alkaline glass substrates such as barium borosilicate glass, aluminoborosilicate glass, aluminosilicate glass, and the like; or ceramic substrates. Plastic substrates or the like may be used as long as it has heat resistance. Alternatively, metal substrates of a stainless steel alloy and the like with the surface provided with an insulating layer may be used. There is no particular limitation on the size of the substrate 100, and any of the following sizes of substrates can be used as appropriate: 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, and the like.

The gate electrode 102 is formed using a metal material such as titanium, molybdenum, chromium, tantalum, tungsten, or aluminum or an alloy material thereof. The gate electrode 102 can be formed in such a manner that a conductive film is formed by a sputtering method or a vacuum evaporation method and is etched using a mask. Alternatively, the gate electrode 102 can be formed by discharge of a conductive nanopaste of gold, silver, copper, or the like by an inkjet method and by baking the conductive nanopaste. Note that a nitride layer of the above-mentioned metal material may be provided between the substrate 100 and the gate electrode 102. Thus, adhesion of the gate electrode 102 can be increased. Further, diffusion of the metal material to the semiconductor layer can be prevented.

Note that it is desired that the gate electrode 102 be processed so that its edge portions are tapered. Thus, disconnection when the semiconductor layer, the wiring, or the like is formed over the gate electrode 102 can be prevented. Further, other wirings can be formed in the same step of forming the gate electrode 102. Note that in this embodiment mode, the gate electrode 102 employs a single layer structure. However, a stacked layer structure of two or more layers can also be used. For example, a stacked layer structure of aluminum and molybdenum, or copper and molybdenum may be used. Further, titanium nitride and tantalum nitride may be used instead of molybdenum. In the case of employing a stacked layer structure, a low resistance material is covered with barrier metal as described above, so that diffusion of a metal element which is contamination source into the semiconductor layer can be prevented.

Figure 1B:
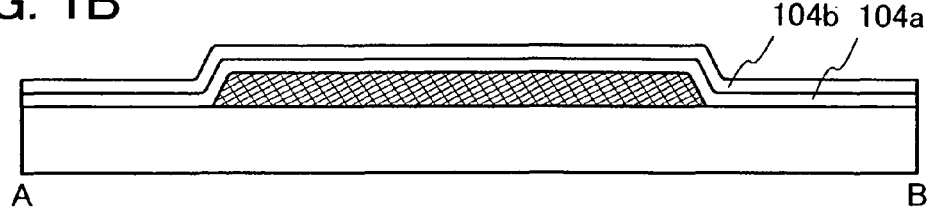

Next a gate insulating layer 104a and a gate insulating layer 104b are formed over the gate electrode 102 (see FIG. 1B). As the insulating layer 104a and the gate insulating layer 104b, a silicon oxide film, a silicon nitride film, a silicon oxynitride film, a silicon nitride oxide film, or the like formed by a CVD method, a sputtering method, or the like may be used. In this embodiment mode, a structure is shown, in which silicon nitride or silicon nitride oxide is used as the gate insulating layer 104a, and silicon oxide or silicon oxynitride is used as the gate insulating layer 104b. Note that the present invention is not limited to the gate insulating layer of two-layer structure. A single layer structure or a stacked layer structure of three or more layers can also be used.

Here, a silicon oxynitride film means a film that contains more oxygen than nitrogen and includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and includes oxygen, nitrogen, silicon, and hydrogen at concentrations ranging from 5 at. % to 30 at. %, 20 at. % to 55 at. %, 25 at. % to 35 at. %, and 10 at. % to 25 at. %, respectively. Note that the above range is a measurement result using Rutherford backscattering spectrometry (RBS) and hydrogen forward scattering (HFS). Note that the content percentages of the component atoms is not beyond 100 at. %.

Note that hydrogen plasma treatment may be performed when the gate insulating layer 104b is formed. The crystal growth of the microcrystalline semiconductor layer is promoted by performing hydrogen plasma treatment to the gate insulating layer. This is because a dangling bond included in the gate insulating layer can be terminated by the hydrogen plasma treatment. Thus, by performing the plasma treatment at the formation of the gate insulating layer 104b, the microcrystalline semiconductor layer characteristics which are obtained can be improved.

Figure 1C:
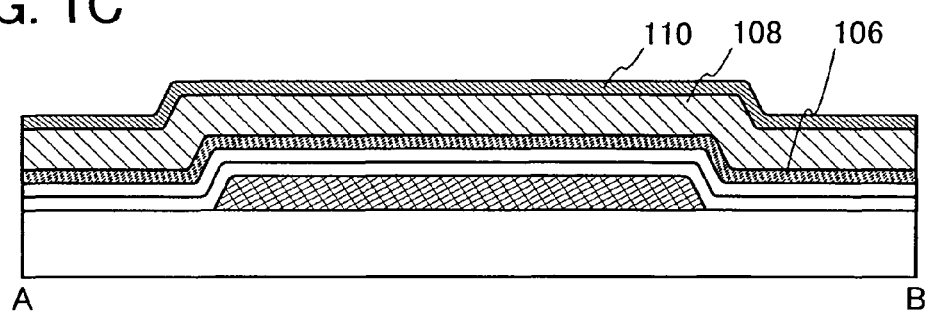

Subsequently, a microcrystalline semiconductor layer 106, a buffer layer 108, and a semiconductor layer 110 to which an impurity element imparting one conductivity type is added are formed over the gate insulating layer 104b in this order (see FIG. 1C).

The microcrystalline semiconductor layer 106 is a layer which contains a semiconductor having an intermediate structure between amorphous and crystalline structures (including a single crystal and a polycrystal). The crystal grains size is approximately equal to or greater than 2 nm and equal to or less than 100 nm. Microcrystalline silicon, which is a typical example of a microcrystalline semiconductor, has a peak of Raman spectrum which is shifted to a lower wave number side than 521 cm$^{-1}$ that represents single-crystal silicon. That is, the peak of a Raman spectrum of microcrystalline silicon is within the range from 480 cm$^{-1}$ which represents amorphous silicon to 521 cm$^{-1}$ which represents single-crystal silicon. In addition, microcrystalline silicon is made to contain hydrogen or halogen of at least 1 at. % or more for termination of dangling bonds. Moreover, microcrystalline silicon is made to contain a rare gas element such as helium, argon, krypton, neon, or the like to enhance lattice distortion, whereby stability is increased and a favorable microcrystalline semiconductor can be obtained.

The microcrystalline semiconductor layer 106 can be formed by a high-frequency plasma CVD with a frequency of several tens to several hundreds of MHz or a microwave plasma CVD with a frequency of 1 GHz or more. As a source gas, silicide diluted with hydrogen typified by $SiH_4$, $Si_2H_6$, $SiH_2Cl_2$, $SiHCl_3$, $SiCl_4$, $SiF_4$, or the like can be used. One or plural kinds of rare gas elements selected from helium, argon, krypton, and neon may be added to above described silicide or hydrogen. The thickness of the microcrystalline semiconductor layer 106 can be equal to or greater than 2 nm and equal to or less than 50 nm, preferably equal to or greater than 10 nm and equal to or less than 30 nm.

The microcrystalline semiconductor layer 106 exhibits low n-type conductivity when an impurity element is not intentionally added. Thus, threshold may be controlled by adding an impurity element imparting p-type conductivity. When boron is used as an impurity element imparting p-type conductivity, boron may be added at the concentration of equal to or greater than $1 \times 10^{14}$ atoms/cm$^3$ and equal to or less than $6 \times 10^{16}$ atoms/cm$^3$, for example.

The buffer layer 108 is a layer including amorphous semiconductor and can be formed by a plasma CVD method using gas of silicide such as $SiH_4$, $Si_2H_6$, $SiH_2Cl_2$, $SiHCl_3$, $SiCl_4$, $SiF_4$, or the like. Alternatively, above described gas of the silicide may be diluted with one kind or plural kinds of rare gas elements selected from helium, argon, krypton, and neon. Further, an amorphous semiconductor layer including hydrogen may be formed by adding hydrogen. An amorphous semiconductor layer including nitrogen may be formed by adding nitrogen or ammonia. An amorphous semiconductor layer including fluorine, chlorine, bromine or iodine may be formed by using gas including fluorine, chlorine, bromine or iodine ($F_2$, $Cl_2$, $Br_2$, $I_2$, HF, HCl, HBr, HI, or the like).

Alternatively, the buffer layer 108 may be formed by a sputtering method using an amorphous semiconductor as a target. As atmosphere for sputtering, hydrogen atmosphere or rare gas atmosphere is preferable: however, the present invention is not limited to this. An amorphous semiconductor layer including nitrogen can be formed by adding ammonia, nitrogen, or $N_2O$. An amorphous semiconductor layer including fluorine, chlorine, bromine or iodine may be formed by adding gas including fluorine, chlorine, bromine or iodine ($F_2$, $Cl_2$, $Br_2$, $I_2$, HF, HCl, HBr, HI, or the like).

After an amorphous semiconductor layer is formed over the surface of the microcrystalline semiconductor layer 106 as the buffer layer 108, the surface of the amorphous semiconductor layer may be hydrogenated, nitrided or halogenated through processing of the surface of the amorphous semiconductor layer with hydrogen plasma, nitrogen plasma, or halogen plasma.

The thickness of the buffer layer 108 can be equal to or greater than 100 nm and equal to or less than 500 nm, preferably equal to or greater than 150 nm and equal to or less than 400 nm, more preferably equal to or greater than 200 nm and equal to or less than 300 nm. The reason why the buffer layer 108 is formed thicker is that a part of the buffer layer 108 is left in the later formation process (etching) of a source region and a drain region. The leakage current (also referred to as "off-current") of a thin film transistor can be reduced by making the buffer layer 108 remain. Further, existence of the buffer layer over the microcrystalline semiconductor layer prevents from oxidation of the microcrystalline semiconductor layer 106, part of which serves as a channel formation region, whereby excellent characteristics can be obtained. Note that a region of the buffer layer where the microcrystalline semiconductor layer and a source region or a drain region are overlapped has the above-mentioned thickness (equal to or greater than 100 nm and equal to or less than 500 nm, preferably equal to or greater than 150 nm and equal to or less than 400 nm, more preferably equal to or greater than 200 nm and equal to or less than 300 nm) which contributes to improvement of withstand voltage.

Note that a region where both of an impurity element imparting n-type conductivity such as phosphorus and an impurity element imparting p-type conductivity such as boron are not included in the buffer layer 108 at the same time is necessarily formed in order to have enough effect of reducing off-current. When these impurity elements are included simultaneously, recombination center is formed, whereby the leakage current is caused. When an n-channel thin film transistor is formed in particular, the semiconductor layer 110 to which an impurity element imparting n-type conductivity is added can be formed over the buffer layer 108 and the microcrystalline semiconductor layer 106 can be added an impurity element imparting p-type conductivity for controlling threshold voltage. Thus, attention is needed in that a region where an impurity element is not included is intentionally formed, and so on.

When an n-channel thin film transistor is formed, as an impurity element adding to the semiconductor layer 110 to which an impurity element imparting one conductivity type is added, phosphorus can be used, for example. When a p-channel thin film transistor is formed, for example, boron can be used as an impurity element. The semiconductor layer 110 to which an impurity element imparting one conductivity type is added may be formed to have a thickness of equal to or greater than 2 nm and equal to or less than 50 nm (preferably, equal to or greater than 10 nm and equal to or less than 30 nm). As a manufacturing method, a plasma CVD method in which gas including an impurity element (for example, $PH_3$ and $B_2H_6$) is added to source gas, or the like can be used.

Figure 1D:
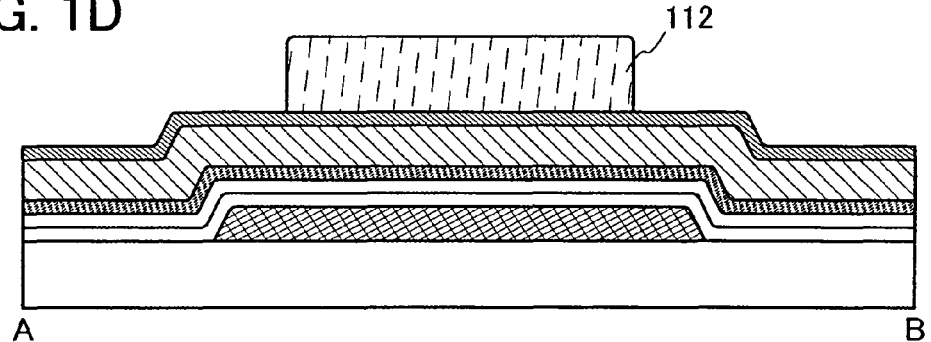

Subsequently, a mask 112 is formed over the semiconductor layer 110 to which an impurity element imparting one conductivity type is added (see FIG. 1D). Note that the gate insulating layer 104a, the gate insulating layer 104b, the microcrystalline semiconductor layer 106, and the buffer layer 108 may be formed successively. Alternatively, the gate insulating layer 104a, the gate insulating layer 104b, the microcrystalline semiconductor layer 106, the buffer layer 108, and the semiconductor layer 110 to which an impurity element imparting one conductivity type is added may be formed successively. At least the gate insulating layer 104a, the gate insulating layer 104b, the microcrystalline semiconductor layer 106, and the buffer layer 108 are formed successively without being exposed to the air, so that each interface can be kept clean. Note that the mask 112 can be formed by a photolithography method or an inkjet method.

Figure 1E:
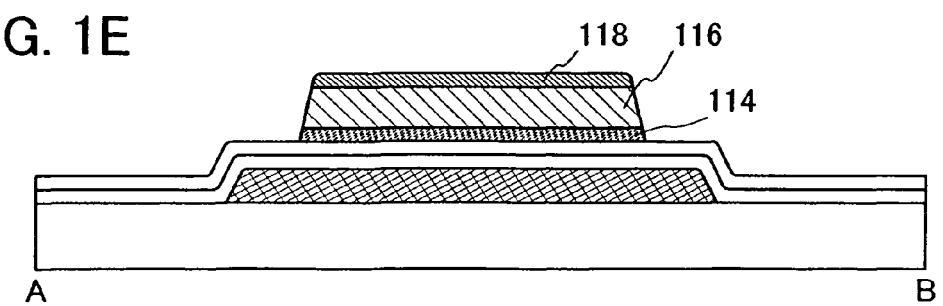

Subsequently, the microcrystalline semiconductor layer 106, the buffer layer 108, and the semiconductor layer 110 to which an impurity element imparting one conductivity type is added is etched by using the mask 112 so as to form a microcrystalline semiconductor layer 114, a buffer layer 116, and a semiconductor layer 118 to which an impurity element imparting one conductivity type is added (see FIG. 1E). Note that FIG. 1B corresponds to cross-sectional views taken along a line A-B of FIG. 4B or FIG. 5B.

Here, end portions of the microcrystalline semiconductor layer 114, the buffer layer 116, and the semiconductor layer 118 to which an impurity element imparting one conductivity type is added are etched to have a tapered shape. Thus, the semiconductor layer 118 to which an impurity element imparting one conductivity type is added and the microcrystalline semiconductor layer 114 can be prevented from being in contact with each other. In the present invention, if the semiconductor layer 118 to which an impurity element imparting one conductivity type is added and the microcrystalline semiconductor layer 114 are in contact with each other, the effect of the buffer layer 116 becomes weak. Thus, the above-mentioned countermeasure is highly effective. Note that above-mentioned taper angle is equal to or greater than 30° and equal to or less than 90°, preferably equal to or greater than 45° and equal to or less than 80°.

Figure 2A:
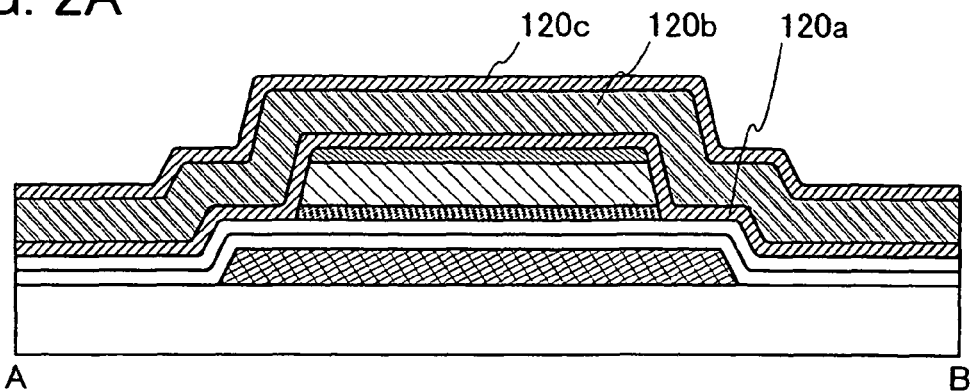
FIGS. 2A to 2C illustrate a manufacturing process of a display device of the present invention.

Subsequently, a conductive layer 120a, a conductive layer 120b, and a conductive layer 120c are stacked in this order over the semiconductor layer 118 to which an impurity element imparting one conductivity type is added and the gate insulating layer 104b (see FIG. 2A). Note that the present invention is not limited to a conductive layer of three-layer structure shown in this embodiment mode. A single layer structure, a stacked layer structure of two layers, or a stacked layer structure of four or more layers can also be used.

A material of the conductive layer 120a, the conductive layer 120b, and the conductive layer 120c includes an element selected from tantalum (Ta), tungsten (W), titanium (Ti), molybdenum (Mo), aluminum (Al), gold (Au), silver (Ag), copper (Cu), chromium (Cr), neodymium (Nd), or an alloy material or a compound material containing the element as its main component. A semiconductor material typified by the polycrystalline silicon doped with an impurity element such as phosphorus, an AgPdCu alloy, or the like may be used. The manufacturing method includes a sputtering method, a vacuum evaporation method, a plasma CVD method, or the like. This embodiment mode shows the case where molybdenum is used for the conductive layer 120a and the conductive layer 120c, and aluminum is used for the conductive layer 120b. However, other structures can be employed. For example, a structure in which titanium is used for the conductive layer 120a and the conductive layer 120c, and aluminum is used for the conductive layer 120b may be employed.

The conductive layer 120a, the conductive layer 120b, and the conductive layer 120c can be formed by a screen printing method, an inkjet method, or the like using a conductive nanopaste.

After that, a mask 122 is formed over the conductive layer 120a, the conductive layer 120b, and the conductive layer 120c. The mask 122 can be formed the same as the mask 112.

Figure 2B:
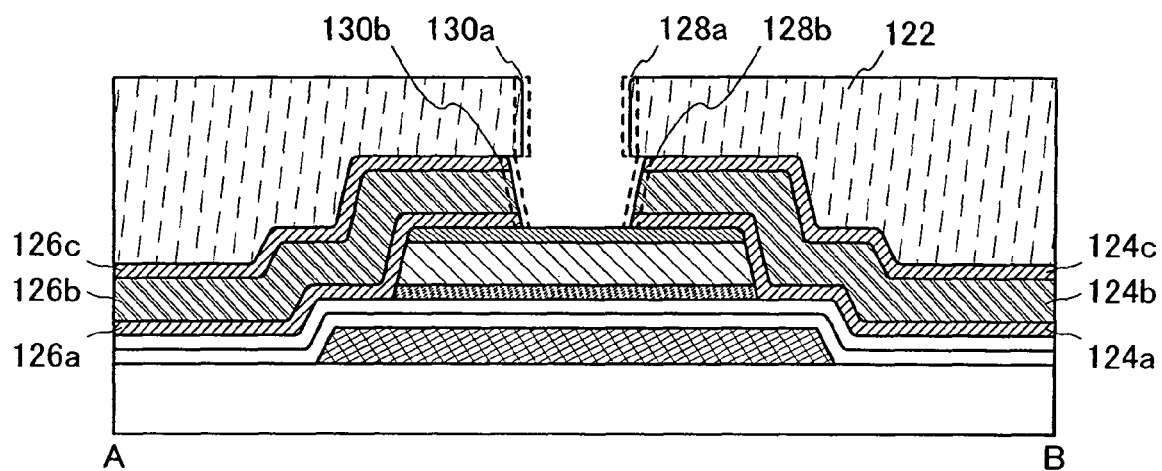

Subsequently, the conductive layer 120a, the conductive layer 120b, and the conductive layer 120c are etched using the mask 122 to form a conductive layer 124a, a conductive layer 124b, and a conductive layer 124c serving as a source electrode or a drain electrode, and a conductive layer 126a, a conductive layer 126b, and a conductive layer 126c serving as a source electrode or a drain electrode (see FIG. 2B). In this embodiment mode, the conductive layer 124a, the conductive layer 124b, the conductive layer 124c, the conductive layer 126a, the conductive layer 126b, and the conductive layer 126c are formed by wet etching. Wet etching is the etching which is isotropic compared to dry etching. Thus, an end portion 128a of the mask 122 and an end portion 128b of the conductive layer 124a, the conductive layer 124b, and the conductive layer 124c are not aligned each other, and an end portion 130a of the mask 122 and an end portion 130b of the conductive layer 126a, the conductive layer 126b, and the conductive layer 126c are not aligned each other.

Subsequently, the semiconductor layer 118 to which an impurity element imparting one conductivity type is added and the buffer layer 116 are etched by using the mask 122 to form a source region or a drain region 132, a source region or a drain region 134, and a buffer layer 136 (see FIG. 2C). Then, the mask 122 is removed. Note that the buffer layer 136 is a layer in which a part of the buffer layer 116 is etched, and covers the surface of the microcrystalline semiconductor layer 114.

The buffer layer 136 formed by etching has a groove, and the end portion of the groove forms a roughly continuous surface with the end portions of the source region or the drain region 132. In addition, the above-mentioned groove is formed in a region roughly aligned with an opening portion of the mask 122.

The leakage current (also referred to as "off-current") of a thin film transistor can be reduced by including the buffer layer 136 as described above. This is because a main part of a carrier path is formed in the buffer layer 136 at off-state. However, only the microcrystalline semiconductor layer serves as a channel at on-state, and the carrier path is not formed in the buffer layer 136. Note that when a groove is formed in the buffer layer 136, the leakage current can be reduced compared to the case where a groove is not provided. This is because a leak path becomes longer corresponding to the groove which is formed. Further, the semiconductor layer 118 to which an impurity element imparting one conductivity type is added is removed completely, so that the leakage current by an impurity element included in a residue can be reduced. In addition, such as hydrogen, fluorine, or the like included in the groove portion of the buffer layer can prevent an impurity element such as oxygen or the like from entering the microcrystalline semiconductor layer. Moreover, the buffer layer 136 is formed over the microcrystalline semiconductor layer 114 so that oxidation of the microcrystalline semiconductor layer 114 serving as the channel formation region can be prevented and excellent characteristics can be obtained.

The buffer layer 136 has a function of preventing a parasitic channel. The buffer layer 136 serves as a stopper at the time of etching of the semiconductor layer 118 to which an impurity element imparting one conductivity type is added. If the buffer layer 136 is not provided, the microcrystalline semiconductor layer 114 is oxidized by the radical reaction in etching. Thus, mobility is lowered and a subthreshold swing (S value) is increased, or the like. When the buffer layer 136 is used as a countermeasure of preventing oxidization, a hydride amorphous semiconductor material, in particular, a-Si:H (hydride amorphous silicon) is preferably used. Since a surface is terminated by hydrogen, oxidation can be prevented.

An end portion 138 of the source region or the drain region 132 and the end portion 128b of the conductive layer 124a, the conductive layer 124b, and the conductive layer 124c are not aligned with each other, and an end portion 140 of the source region or the drain region 134 and the end portion 130b of the conductive layer 126a, the conductive layer 126b, and the conductive layer 126c are not aligned with each other. The end portion 138 and the end portion 140 are located inner side of the end portion 128b and the end portion 130b.

Figure 2C:
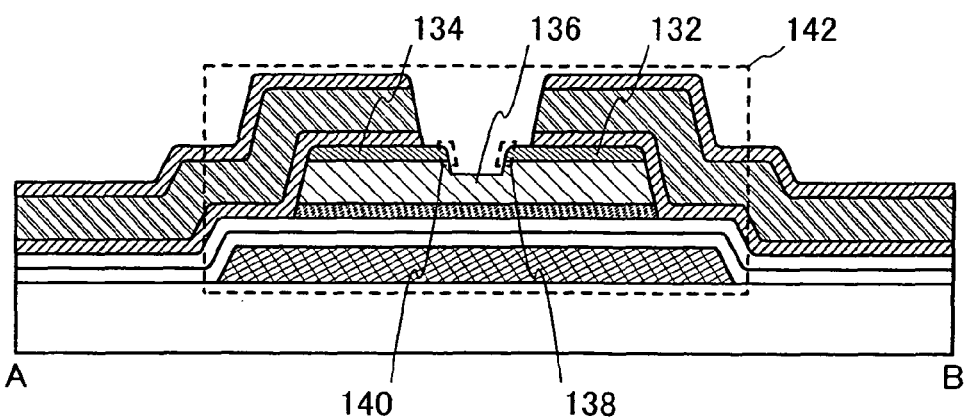
Figure 4C:
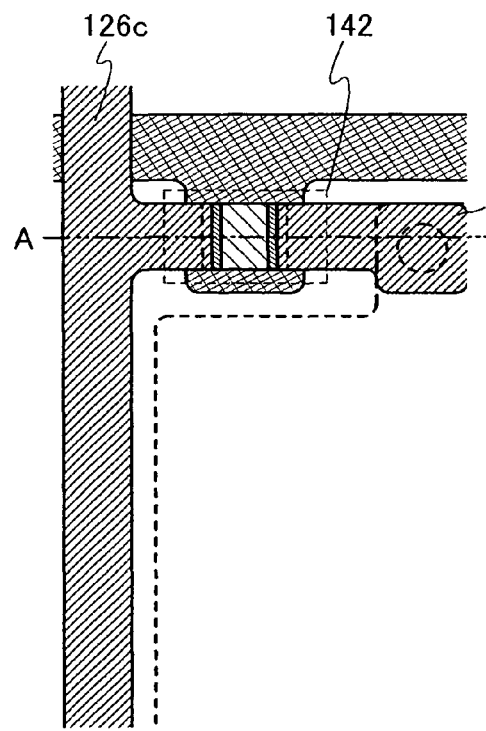
Figure 4D:
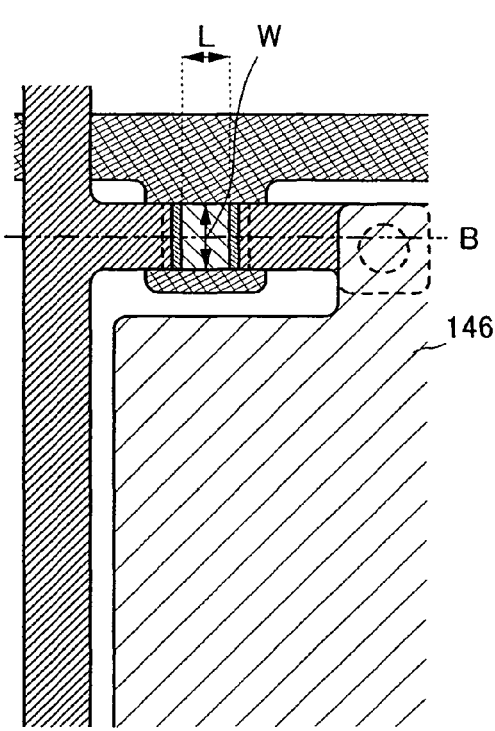
Figure 5C:
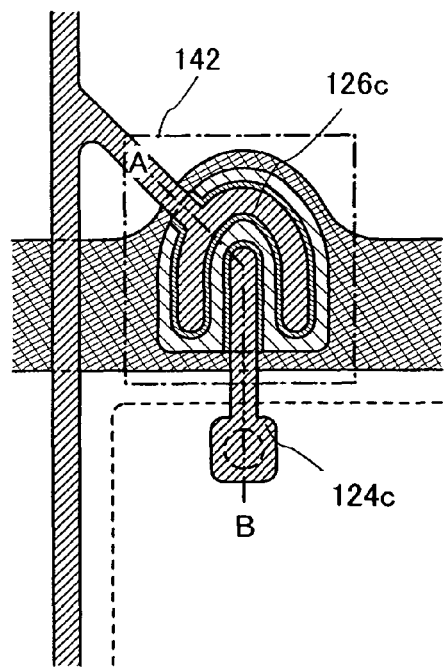
Figure 5D:
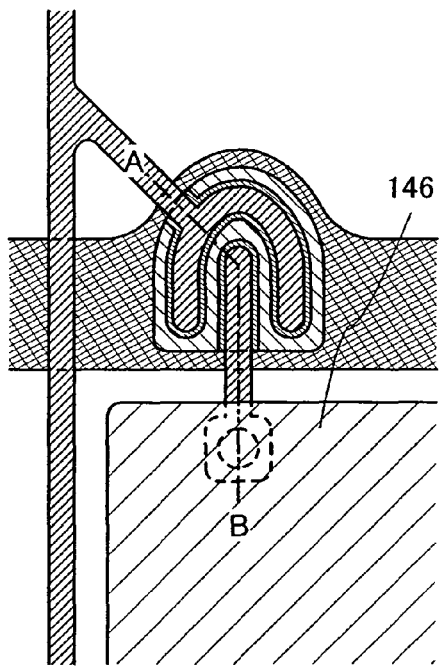

Note that FIG. 2C corresponds to cross-sectional views along a line A-B of FIG. 4C or FIG. 5C. From FIG. 4C and FIG. 5C, it is found that the end portion 128b and the end portion 130b are located outer side of the end portion 138 and the end portion 140. Further, one of the source electrode and the drain electrode serves as a source wiring or a drain wiring.

By the above-mentioned steps, a thin film transistor 142 including the microcrystalline semiconductor layer 114 as the channel formation region and the buffer layer 136 over the microcrystalline semiconductor layer 114 can be formed.

Figure 3A:
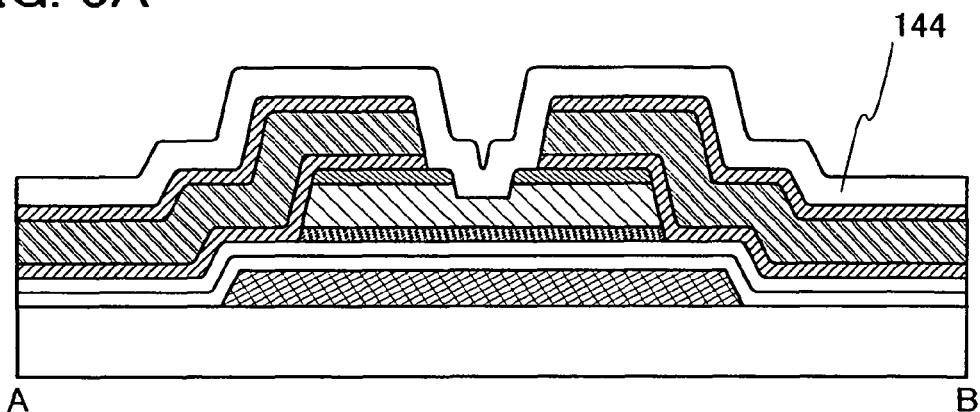
FIGS. 3A to 3C illustrate a manufacturing process of a display device of the present invention.

Subsequently, an insulating layer 144 is formed so as to cover the thin film transistor 142 (see FIG. 3A). The insulating layer 144 can be formed the same as the gate insulating layer 104a and the gate insulating layer 104b. The insulating layer 144 is preferably a dense film which is provided in order to prevent a contamination impurity such as an organic substance or a metal contained in the atmosphere, or moisture from entering.

Figure 3B:
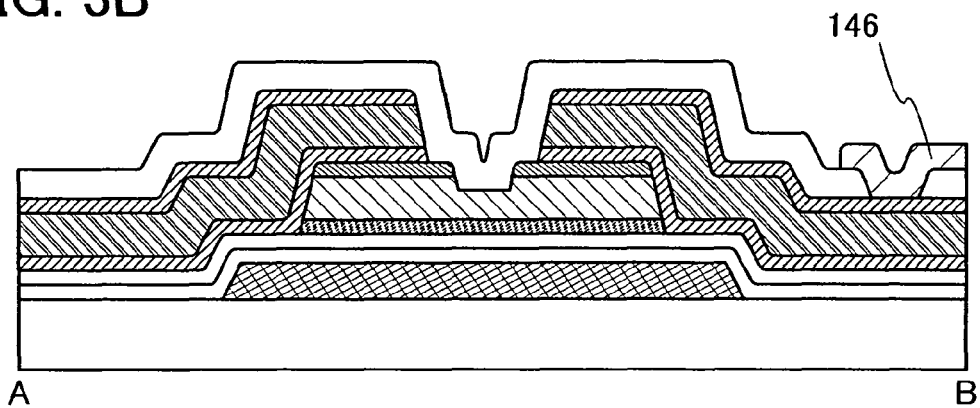

Subsequently, a contact hole is formed in the insulating layer 144 to form a pixel electrode 146 in contact with the conductive layer 124c at the contact hole (see FIG. 3B). Note that FIG. 3B corresponds to cross-sectional views along a line A-B of FIG. 4D or FIG. 5D.

The pixel electrode 146 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, also referred to as "ITO"), indium zinc oxide, or indium tin oxide to which silicon oxide is added.

A conductive composition including a conductive high molecule (also referred to as a "conductive polymer") can also be used for the pixel electrode 146. It is preferable that a sheet resistance of the thin film is 10000 Ω/square or less in the conductive composition. When a thin film is formed as a pixel electrode layer having a light-transmitting property, it is preferable that the conductive composition has a light transmittance of 70% or more at a wavelength of 550 nm. In addition, it is preferable that the resistivity of the conductive high-molecular compound contained in the conductive composition be 0.1 Ω·cm or less.

As the above-mentioned conductive high-molecular compound, a so-called π conjugated system conductive high-molecule can be used. Examples include polyaniline and its derivatives, polypyrrole and its derivatives, polythiophene and its derivatives, copolymers of them, or the like.

Figure 3C:
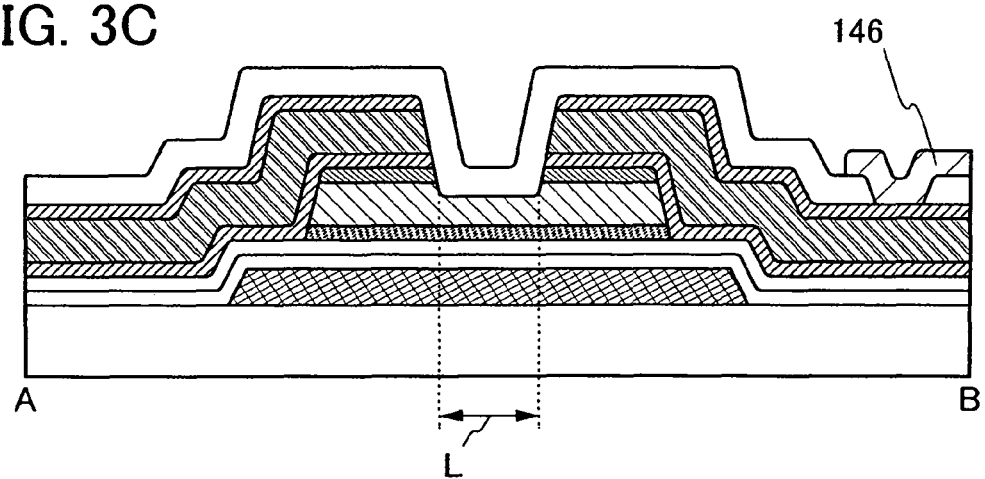

In this embodiment mode, a transistor having a structure in which the end portion 128b and the end portion 138, and the end portion 130b and the end portion 140 are not aligned with each other. However, a structure in which these end portions are aligned with each other may be employed. FIG. 3C illustrates a cross-sectional view of a thin film transistor having a form in which these end portions are aligned with each other. Strong anisotropic dry etching may be used to make aligned the shape of end portions like FIG. 3C. When the semiconductor layer to which an impurity element imparting one conductivity type is added is etched using the conductive layer 124a, the conductive layer 124b, and the conductive layer 124c serving as the source electrode or the drain electrode, and the conductive layer 126a, the conductive layer 126b, and the conductive layer 126c serving as the source electrode or the drain electrode as a mask, the end portions can be aligned.

After an orientation film or the like is provided, a counter substrate is attached, liquid crystal is sealed, various kinds of driver circuits are mounted, and so on. Then, a liquid crystal display device is completed (see FIGS. 6A and 6B). FIG. 6A is a plan view of the liquid crystal display device. FIG. 6B is a cross-sectional view along a line C-D of FIG. 6A. Note that a part of stacked structures or the like of the transistor is omitted for simplification in FIGS. 6A and 6B.

In the liquid crystal display device shown in FIGS. 6A and 6B, a sealing material 606 is provided so as to surround a pixel portion 602 over the substrate 600 and a scan line driver circuit 604. In addition, a counter substrate 608 is provided over the pixel portion 602 and the scan line driver circuit 604. In other words, the pixel portion 602, the scan line driver circuit 604, and liquid crystal 610 are sealed by the substrate 600, the sealing material 606, and the counter substrate 608. Further, a signal line driver circuit 612 formed by a single-crystal semiconductor or a polycrystalline semiconductor which is prepared separately is mounted in a region which is different from the region surrounded by the sealing material 606 over the substrate 600. FIG. 6B illustrates a transistor 614 included in the signal line driver circuit 612.

The pixel portion 602 over the substrate 600 and the scan line driver circuit 604 include a plurality of thin film transistors. FIG. 6B illustrates a thin film transistor 616 included in the pixel portion 602. The thin film transistor 616 corresponds to a thin film transistor using a microcrystalline semiconductor, and it can be manufactured in the above-mentioned steps.

Further, a spherical spacer 622 is provided in order to control an interval (a cell gap) between a pixel electrode 618 and a counter electrode 620. Instead of the spherical spacer, a spacer which is obtained by etching an insulating layer as selected may be used.

A variety of signals are supplied to the scan line driver circuit 604 and the signal line driver circuit 612 from an FPC 628 through lead wirings 624 and 626. In addition, a connection terminal 630 is formed over the lead wiring 626, and the FPC 628 and the connection terminal 630 are electrically connected through an anisotropy conductive material 632. Note that in this embodiment mode, the connection terminal 630 and the pixel electrode 618 are formed using the same conductive layer, and the lead wirings 624 and 626 are formed using the same wiring 634. However, the present invention is not limited to this.

Note that it is not illustrated in FIGS. 6A and 6B, but the liquid crystal display device of the present invention includes an orientation film, a polarizing plate, and further, may include a color filter (also called a colored film, hereinafter), a shielding film, or the like.

FIGS. 6A and 6B illustrate an example in which the signal line driver circuit 612 is separately formed and mounted over the substrate 600; however, the present invention is not limited to this structure. The signal line driver circuit may be formed over the same substrate depending on the characteristics of the transistor. Of course, a scan line driver circuit may be formed separately. Alternatively, a part of a signal line driver circuit or part of a scan line driver circuit may be separately formed and mounted over a substrate.

Thus, the liquid crystal display device using the microcrystalline semiconductor as a channel formation region of a pixel transistor is provided by the present invention. Note that the structure of the transistor, and the liquid crystal display device are only an example, and the present invention is not limited to this.

Note that the channel width (W) of the transistor used for the liquid crystal display device of the present invention becomes larger than the smallest processing dimension (d). Here, the smallest processing dimension (d) means the smallest size among the width of the contact portion, the channel length, the wiring width, or the like of the transistor. In other words, the transistor used for the liquid crystal display device of the present invention is formed so as to satisfy the relation of $d \leq W$. This is because the channel width of the transistor using a microcrystalline semiconductor is not restricted by the resolution of an exposure apparatus.

The upper limit of the channel width (W) can refer to the channel width ($W_a$) of a transistor having equal current drive capability to the transistor and formed using an amorphous semiconductor. In other words, the channel width (W) is defined as $W \leq W_a$ using the channel width ($W_a$). This is because mobility of a carrier in the microcrystalline semiconductor is higher than that of the amorphous semiconductor, and when the transistors are formed having the same current drive capability, the channel width in the case of using microcrystalline semiconductor is smaller than the case of using the amorphous semiconductor. Here, as for the parameter except for the channel width ($W_a$) of the transistor using the amorphous semiconductor which is comparative object, attention is needed to set the parameter the same as the transistor of the present invention.

In the transistor used for the liquid crystal display device of the present invention, the channel width (W) and the channel length (L) satisfy the relation of $0.1 \leq W/L \leq 2.0$ (or $0.1 \leq W/L < 2.0$), preferably $0.1 \leq W/L \leq 1.5$, more preferably $0.1 \leq W/L \leq 1.0$. When a transistor using the amorphous semiconductor is used for the pixel of the liquid crystal display device here, the channel width ($W_a$) and the channel length ($L_a$) is approximately $20 \leq W_a \leq 100$, and approximately $3 \leq L_a \leq 10$ (the unit of both equations is µm), that is, approximately $2.0 \leq W_a/L_a \leq 33.3$. On the other hand, when a transistor using the microcrystalline semiconductor of the present invention is used for the pixel of the liquid crystal display device, the channel width ($W_a$) and the channel length ($L_a$) is approximately $1 \leq W \leq 5$, and approximately $3 \leq L \leq 10$ (the unit of both equations is µm), that is, approximately $0.1 \leq W/L \leq 1.7$.

Note that when a transistor using the polycrystalline semiconductor is used for the pixel of the liquid crystal display device, the channel width ($W_p$) is largely restricted by the resolution of an exposure apparatus. In other words, it is difficult to manufacture the pixel transistor which is made use of performance of a polycrystalline semiconductor adequately. Considering the mobility or the like, $W_p \leq 0.5$ is suitable condition under the condition in which the channel length ($L_p$) of the transistor using the polycrystalline semiconductor and the channel length of the transistor using the using microcrystalline semiconductor are equal ($3 \leq L_p \leq 10$), and $W_p/L_p \leq 0.6$ is obtained. However, the obtained value of $W_p/L_p$ is not realistic and is meaningless.

Note that when the specific channel width (W) of the transistor used for the liquid crystal display device of the present invention is defined, the width may be equal to or grater than 1 µm and equal to or less than 10 µm (preferably, equal to or grater than 1 µm and equal to or less than 5 µm). The channel width can be defined such that the lower limit is the resolution of the exposure apparatus and the upper limit can be approximately "limit of the resolution of the exposure apparatus plus 5 µm".

Usually, when a transistor using the amorphous semiconductor is employed for the liquid crystal display device, the transistor is manufactured, of which channel width is equal to or grater than 20 µm and equal to or less than 100 µm. Since the mobility of a carrier of the amorphous semiconductor is low, the channel width is formed larger. However, the size of a transistor becomes large and coupling capacitor also becomes large in the case of employing larger channel width, whereby a problem of decreasing the aperture ratio occurs as described above. From this point of view, since a transistor is manufactured using the microcrystalline semiconductor of which mobility of a carrier is high compared to that of the amorphous semiconductor, the channel width in the case of using the microcrystalline semiconductor can be adequately small compared to the case of using the amorphous semiconductor. That is, the problem of coupling capacitor is solved, whereby the aperture ratio can be improved.

Further, the mobility of a carrier of the transistor using the polycrystalline semiconductor is higher than that of the transistor using the microcrystalline semiconductor. Thus, the channel width of the transistor using the polycrystalline semiconductor can be reduced than that of the microcrystalline semiconductor theoretically. However, the resolution of the exposure apparatus used for manufacturing the liquid crystal display device is approximately several µm (for example, 3 µm). Realistically, the channel width which is smaller than the resolution can not be employed. Thus, there is less advantages for employing the polycrystalline semiconductor as a pixel transistor of the liquid crystal display device. On the contrary, since the polycrystalline semiconductor has high electric conductivity and the leakage current of the transistor using the polycrystalline semiconductor at off-state is large, a storage capacitor is needed to be large in order to hold necessary electric charges for display for a certain period. In other words, the aperture ratio decreases even when the polycrystalline semiconductor is used. In addition, the aperture ratio decreases when transistors are serially-connected so as to reduce leakage current.

In this respect, in the transistor using the microcrystalline semiconductor, the relation between the current and the channel width which are needed is most suitable for the liquid crystal display device and a liquid crystal display device having the largest aperture ratio can be provided.

Note that in the transistor using the microcrystalline semiconductor of the present invention, a buffer layer (an amorphous semiconductor layer) is stacked over the microcrystalline semiconductor layer of the channel formation region. Thus, a main leak path is formed in the buffer layer (the amorphous semiconductor layer) side having low electric conductivity, whereby the leakage current can be further reduced. In other words, the storage capacitor can be further smaller; thus, the aperture ratio can be improved.

The buffer layer has other various effects. The examples include an effect of preventing oxidation of the microcrystalline semiconductor of the channel formation region. As another example, an effect of preventing penetration of an impurity element into the microcrystalline semiconductor can be given. Variation of characteristics of each transistor can be reduced by these effects, need for considering variation of the transistors in manufacturing the liquid crystal display device is reduced. In other words, the design with a margin in order to prevent from effect of variations of the transistor becomes unnecessary. From the view point of charge retention, even in the situation that a conventionally sufficient storage capacitor being provided, the margin becomes needless. Thus, the storage capacitor can be small, whereby the aperture ratio can be improved.

Note that the characteristics of the microcrystalline semiconductor are excellent in the meaning of reducing variation of a transistor. The crystal grain sizes of each polycrystalline semiconductor vary, and the channel formation region of a transistor manufactured using the polycrystalline semiconductor is formed from a few crystal grains. Thus, variation of characteristics of each transistor tends to be large. On the other hand, the crystal grain sizes of the microcrystalline semiconductor are equal, and the channel formation region of the transistor is formed from many crystal grains. Thus, variation of characteristics of the transistor can be reduced.

Embodiment Mode 2

In this embodiment, a manufacturing method of a transistor, in which a microcrystalline semiconductor layer is irradiated with laser beam, so that the crystallinity is improved, with reference to FIGS. 7A to 7D.

First, a gate electrode is formed over the substrate in the similar manner to Embodiment Mode 1. Then, a gate insulating layer is formed so as to cover a gate electrode (not shown). After that, a microcrystalline semiconductor layer is formed over a gate insulating layer 700 (see FIG. 7A).

In the above-described manner, when the microcrystalline semiconductor layer is formed over the gate insulating layer 700 by a plasma CVD method or the like, a region which contains many amorphous components (here, such a region is referred to as "an interface region 704") is formed, in some cases, near the interface between the gate insulating layer 700 and a semiconductor layer 702. In the case where an ultra-thin microcrystalline semiconductor film with a thickness of about 10 nm or less is formed by a plasma CVD method or the like, it is difficult to obtain a semiconductor layer containing microcrystalline grains, which has uniformity throughout the film. In these cases, a process of laser beam irradiation to be described below is effective.

Figure 7A:
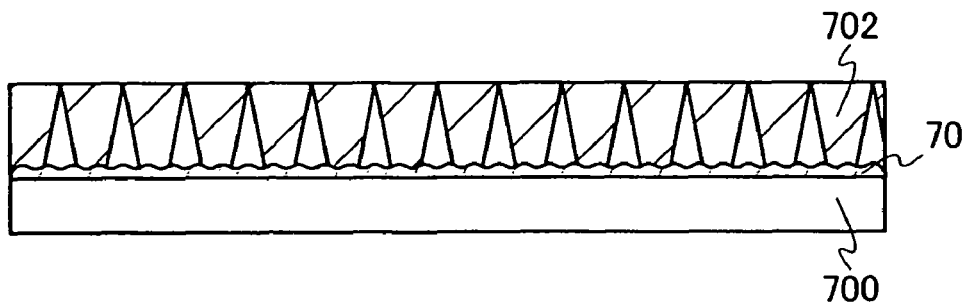
FIGS. 7A to 7D illustrate a manufacturing process of a display device of the present invention.
Figure 7B:
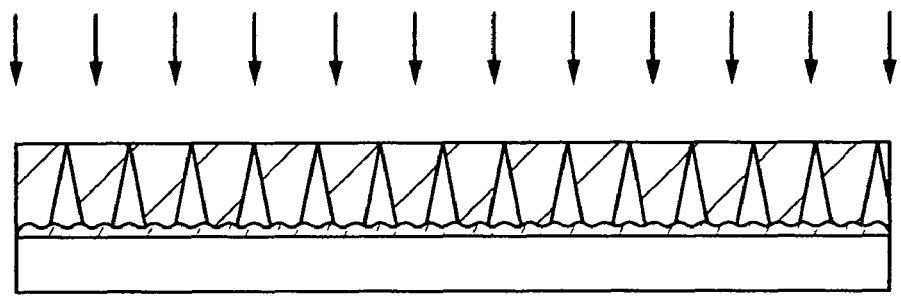

After the semiconductor layer 702 is formed, the semiconductor layer 702 is irradiated with a laser beam having such an energy density that the semiconductor layer 702 is not melted, from the upper side of the semiconductor layer 702 (opposite surface of the interface region 704) (see FIG. 7B). This laser process (hereinafter, also referred to as "LP") involves solid-phase crystal growth which is performed by radiation heating without the semiconductor layer 702 being melted. That is, the laser process is a method for crystal growth utilizes a critical region where a deposited the semiconductor layer 702 is not brought into a liquid phase, and in that sense, the crystal growth can also be referred to as "critical growth".

Figure 7C:
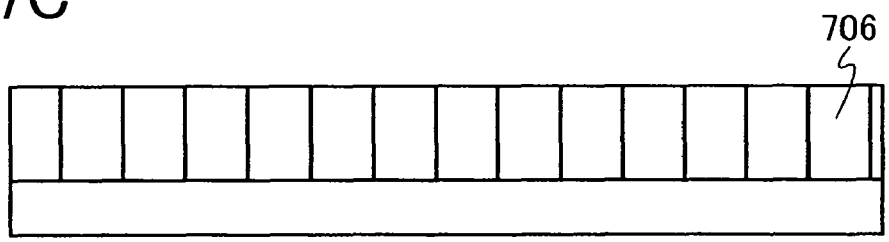
Figure 7D:
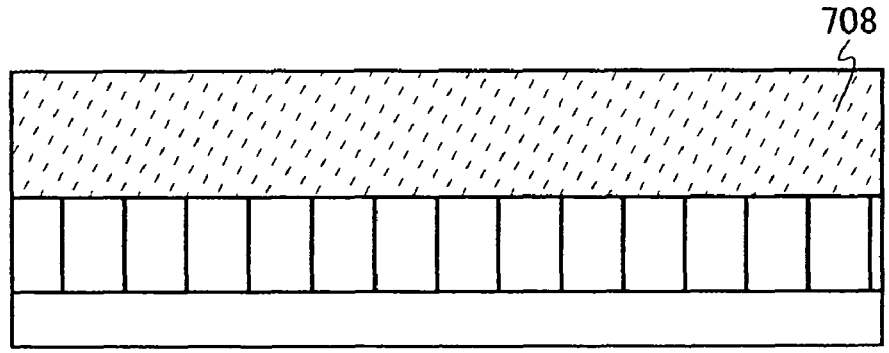

A cross-sectional view after the irradiation with a laser beam is shown in FIG. 7C. For the laser beam, an excimer laser beam with a wavelength of 400 nm or less or a second harmonic (with a wavelength of 532 nm) to a fourth harmonic (with a wavelength of 266 nm) of a YAG laser or a YVO$_4$ laser is preferably used. Although other laser beam also can be used in the case of the same wavelength level, it is preferable to use a high power laser as mentioned above in order to increase productivity. The laser beam is condensed into a linear or spot shape with an optical system, the energy density is adjusted within the range where the semiconductor layer 702 is not melted, and irradiation is performed. Since the laser beam is condensed to the energy density such that the semiconductor layer 702 is not melted (in other words, low energy density), the irradiation area of the laser beam can be increased. That is, even a large-sized substrate can be processed in a short time.

The laser beam can affect to the interface region 704. Accordingly, using the crystals on the surface side of the semiconductor layer 702 (upper surface in the view) as nuclei, solid-phase crystal growth advances from the surface toward the interface region 704, and roughly columnar crystals grow. The solid-phase crystal growth by the LP treatment is not to increase the size of crystal grains but rather to improve crystallinity along a film thickness direction and to put the crystal grain size in order.

In this case, for example, a semiconductor layer over a glass substrate of 730 mm×920 mm can be processed by a single scan when laser beam is condensed into a long rectangular shape (a linear shape). The proportion of overlap of linear laser beams (the overlap rate) is set to be equal to or greater than 0% and equal to or less than 90% (preferably, equal to or greater than 0% and equal to or less than 67%) when a pulsed laser such as excimer laser, or the like is used. Accordingly, the length of processing time for each substrate can be shortened, so that it is advantageous in productivity. The shape of the laser beam is not limited to a linear shape, and similar processing can be achieved using a planar laser beam. In addition, the LP treatment of this embodiment can be applied to various sizes of substrates without being limited to the above-mentioned size of the glass substrate.

Above described critical growth also has a feature in that unevenness (a projection called a ridge), which is observed on the surface of the polycrystalline semiconductor (so-called low-temperature polysilicon) processed by using conventional laser treatment, is not formed and the smoothness of semiconductor surface is maintained even after the LP treatment. As in this embodiment, a crystalline semiconductor layer 706 which is obtained by irradiating the microcrystalline silicon film after the film formation with the laser beam is different in film quality from a microcrystalline silicon film which is obtained by film formation. In addition, it is also different in growth mechanism and film quality from a microcrystalline silicon film which is modified by conductive heating.

In this specification, among the crystalline semiconductors obtained by performing LP treatment to the microcrystalline semiconductor layer after film formation, the case where silicon is used is particularly called laser process semi amorphous silicon (LPSAS). Although LPSAS is a semiconductor having more preferable characteristics compared to the conventional microcrystalline silicon, LPSAS remains one of the microcrystalline silicon. Thus, microcrystalline silicon means both of the conventional microcrystalline silicon and LPSAS in this specification. The conventional microcrystalline silicon and LPSAS are treated separately when it is necessary in particular. Similarly, "microcrystalline silicon semiconductor" includes both of the conventional microcrystalline silicon semiconductor and the crystalline semiconductor performed LP treatment.

Next, a buffer layer 708 is formed over the crystalline semiconductor layer 706. Note that in the case of forming a-Si:H (hydrogenated amorphous silicon) as the buffer layer 708, hydrogen is supplied to the crystalline semiconductor layer 706. Thus, the same effect can be obtained as the crystalline semiconductor layer 706 is crystallized. That is, an a-Si:H layer is formed over the crystalline semiconductor layer 706, so that a dangling bond is terminated by diffusing hydrogen in the crystalline semiconductor layer 706. Note that the a-Si:H layer is preferably formed by a plasma CVD method at a temperature of equal to or greater than 300° C. and equal to or less than 400° C.

The following steps are the same as Embodiment Mode 1, and thus, a description is omitted here.

Electrical characteristics of a transistor can be further improved by using the semiconductor performed LP treatment such as LPSAS, which is formed in this embodiment mode.

This embodiment mode can be combined with Embodiment Mode 1 as appropriate.

Embodiment Mode 3

In this embodiment mode, details of a liquid crystal display device including the thin film transistor (hereinafter, also referred to as a "TFT") shown in Embodiment Modes 1 and 2 is described with reference to FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, and FIG. 21. The thin film transistor used for the liquid crystal display device illustrated in FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, and FIG. 21 can be manufactured in the similar manner to the thin film transistor shown in Embodiment Modes 1 and 2.

First, liquid method crystal display device of a vertical alignment (VA) mode is described. The VA is a kind of mode in which alignment of liquid crystal molecules of a liquid crystal display panel is controlled. The VA liquid crystal display device is a mode in which the major axis of liquid crystal molecules is vertical to a panel surface when voltage is not applied. In particular, in this embodiment mode, it is devised that a pixel is divided into several regions (sub-pixels) so that molecules are aligned in different directions in the respective regions when voltage is applied. This is referred to as domain multiplication or multi-domain design. In the following description, a VA liquid crystal display device with multiplied domain is described.

Figure 8:
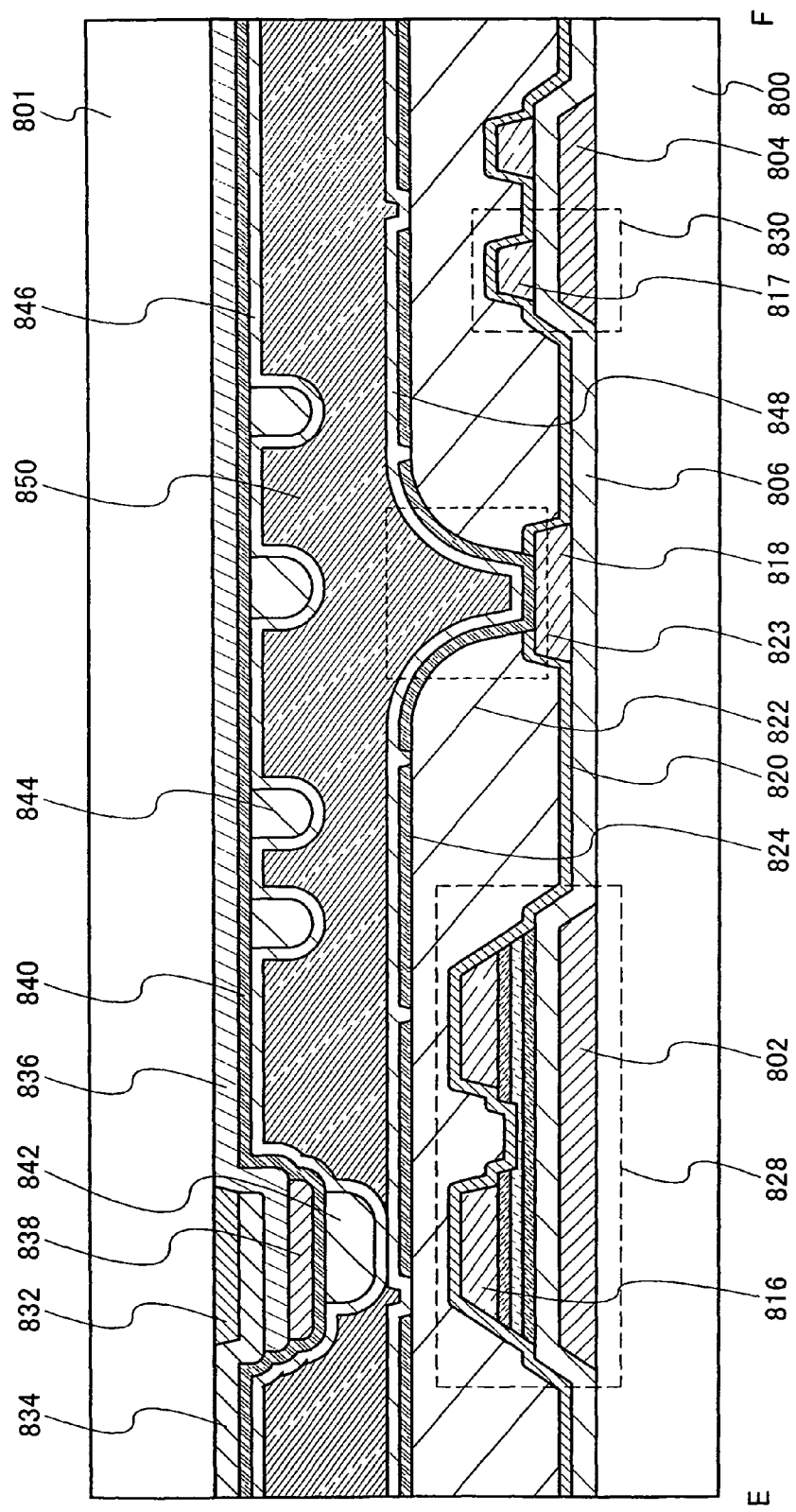
FIG. 8 is a cross-sectional view of a display device of the present invention.
Figure 9:
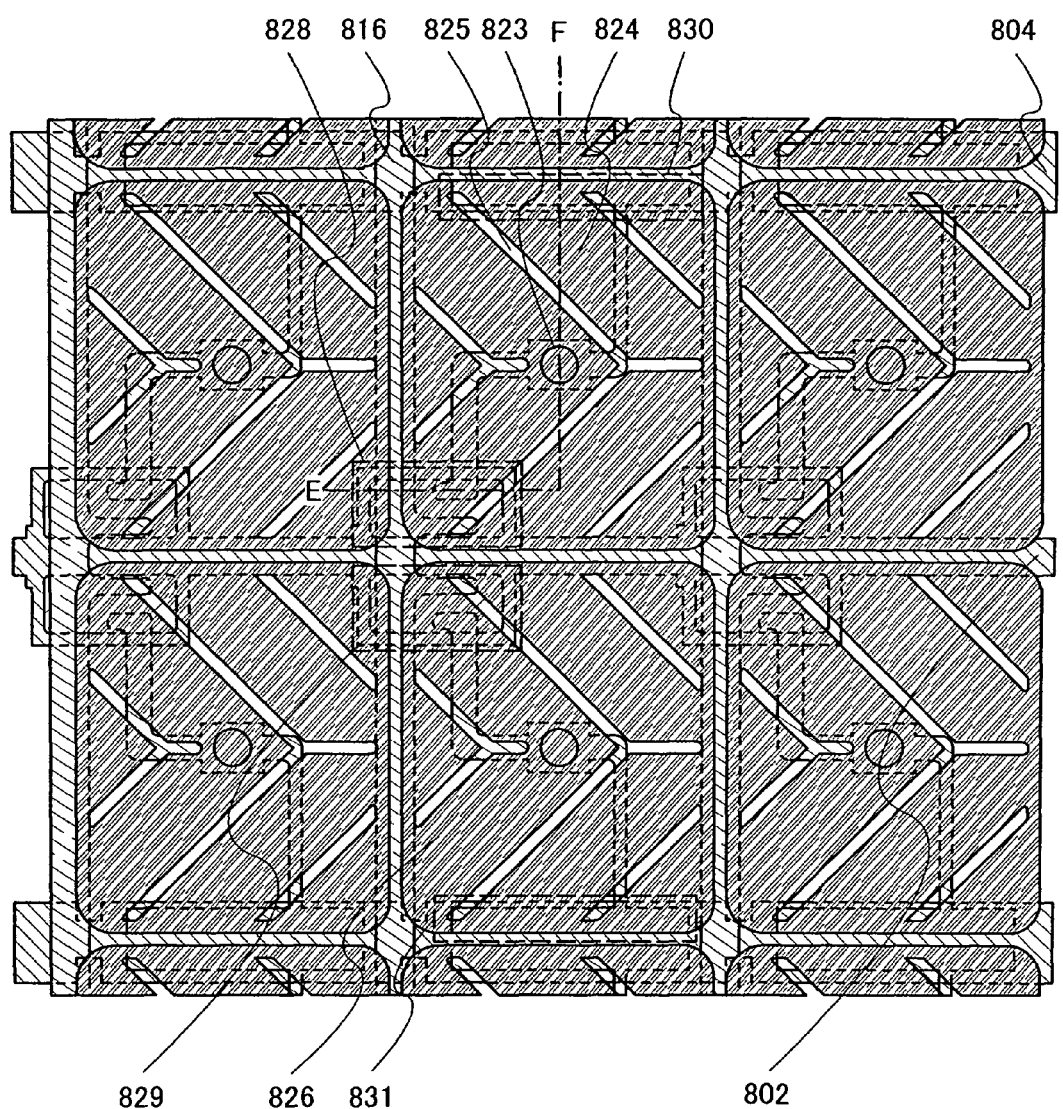
FIG. 9 is a plan view of a display device of the present invention.
Figure 10:
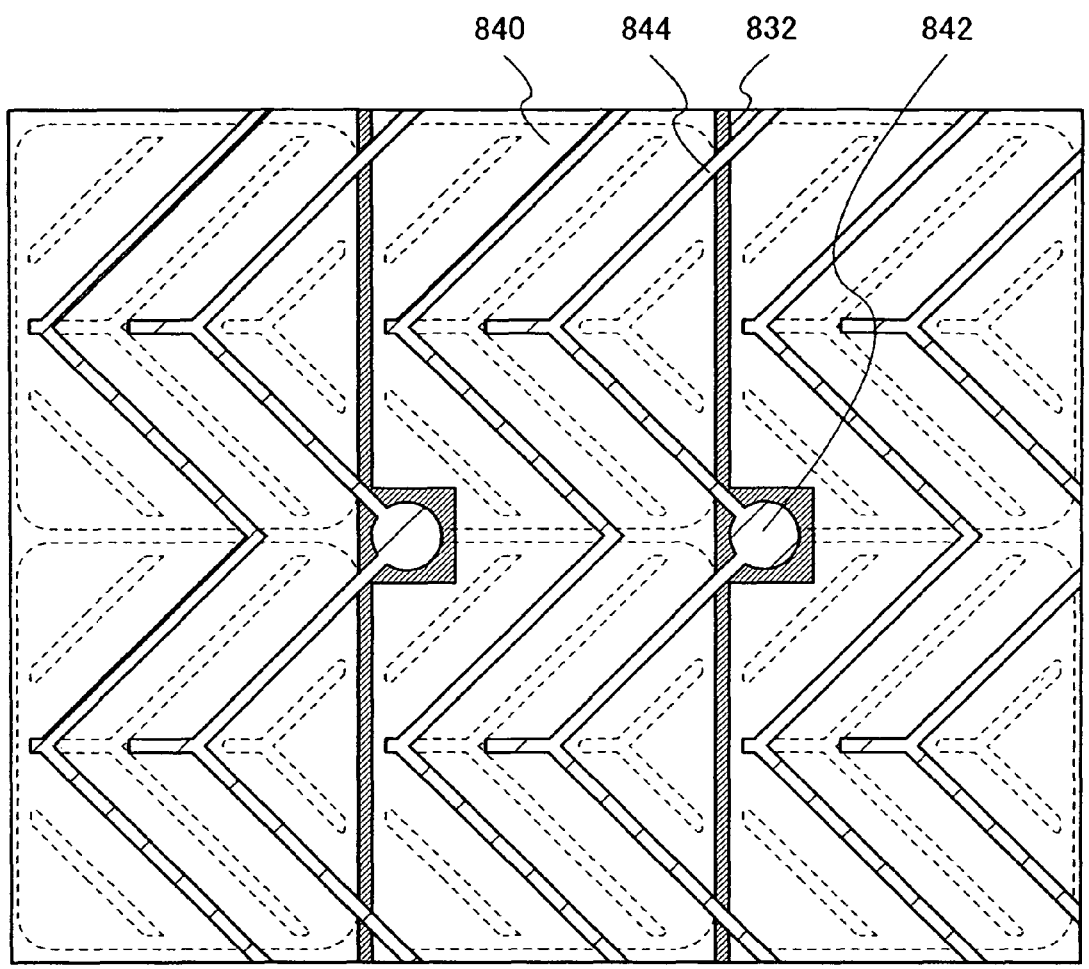
FIG. 10 is a plan view of a display device of the present invention.

FIG. 8, FIG. 9, and FIG. 10 illustrate an example of the VA liquid crystal display device with multiplied domain. FIG. 8 is a cross-sectional view. FIG. 9 is a plan view of a side of a substrate on which the pixel electrode is formed. FIG. 10 is a plan view of a side of a substrate on which the counter electrode is formed. Note that FIG. 8 corresponds to a cross-sectional along a line E-F in FIG. 9. Hereinafter, description is made with reference to these drawings.

FIG. 8 illustrates a state in which a substrate 800 provided with a TFT 828, a pixel electrode 824 connected to the TFT 828, and a storage capacitor portion 830 overlaps with a counter substrate 801 provided with a counter electrode 840 and the like, and liquid crystal is injected.

At the position where a spacer 842 is formed on the counter substrate 801, a light shielding film 832, a first colored film 834, a second colored film 836, a third colored film 838, and the counter electrode 840 are formed. With this structure, the height of a projection 844 for controlling alignment of the liquid crystal and the height of the spacer 842 vary. An orientation film 848 is formed over the pixel electrode 824. Similarly, the counter electrode 840 is also provided with an orientation film 846. A liquid crystal layer 850 is formed between the orientation films 846 and 848.

Although a columnar spacer is used for the spacer 842 here, a bead spacer which is spherical may be dispersed. Further, the spacer 842 may be formed over the pixel electrode 824 provided over the substrate 800.

The TFT 828, the pixel electrode 824 connected to the TFT 828, and the storage capacitor portion 830 are formed over the substrate 800. As for the pixel electrode 824, a first insulating film 820 and a second insulating film 822 are connected to a wiring 818 via a contact hole 823 which penetrates therethrough. The thin film transistor described in Embodiment Mode 1 or 2 can be used as the TFT 828 as appropriate. The storage capacitor portion 830 includes a capacitor wiring 804 which is formed in a similar manner to a gate wiring 802 of the TFT 828, a gate insulating film 806, a capacitor wiring 817 which is formed in a similar manner to a wirings 816 and 818.

A liquid crystal element is formed by overlapping of the pixel electrode 824, the liquid crystal layer 850, and the counter electrode 840.

FIG. 9 illustrates a structure over the substrate 800. The pixel electrode 824 is formed using the material described in Embodiment Mode 1. The pixel electrode 824 is provided with a slit 825. The slit 825 is for controlling alignment of the liquid crystal.

A TFT 829, a pixel electrode 826 connected to the TFT 829, and a storage capacitor portion 831 shown in FIG. 9 can be formed in a similar manner to the TFT 828, the pixel electrode 824 connected to the TFT 828, and the storage capacitor portion 830, respectively. Both the TFT 828 and the TFT 829 are electrically connected to the wiring 816. A pixel of the liquid crystal display device includes the pixel electrodes 824 and 826. Each of the pixel electrode 824 and 826 is a sub-pixel.

FIG. 10 illustrates a structure of the counter substrate side. The counter electrode 840 is formed over the light shielding film 832. The counter electrode 840 is preferably formed using a material similar to the pixel electrode 824. The projection 844 for controlling alignment of the liquid crystal is formed over the counter electrode 840. Moreover, the spacer 842 is formed corresponding to the position of the light shielding film 832.

Figure 11:
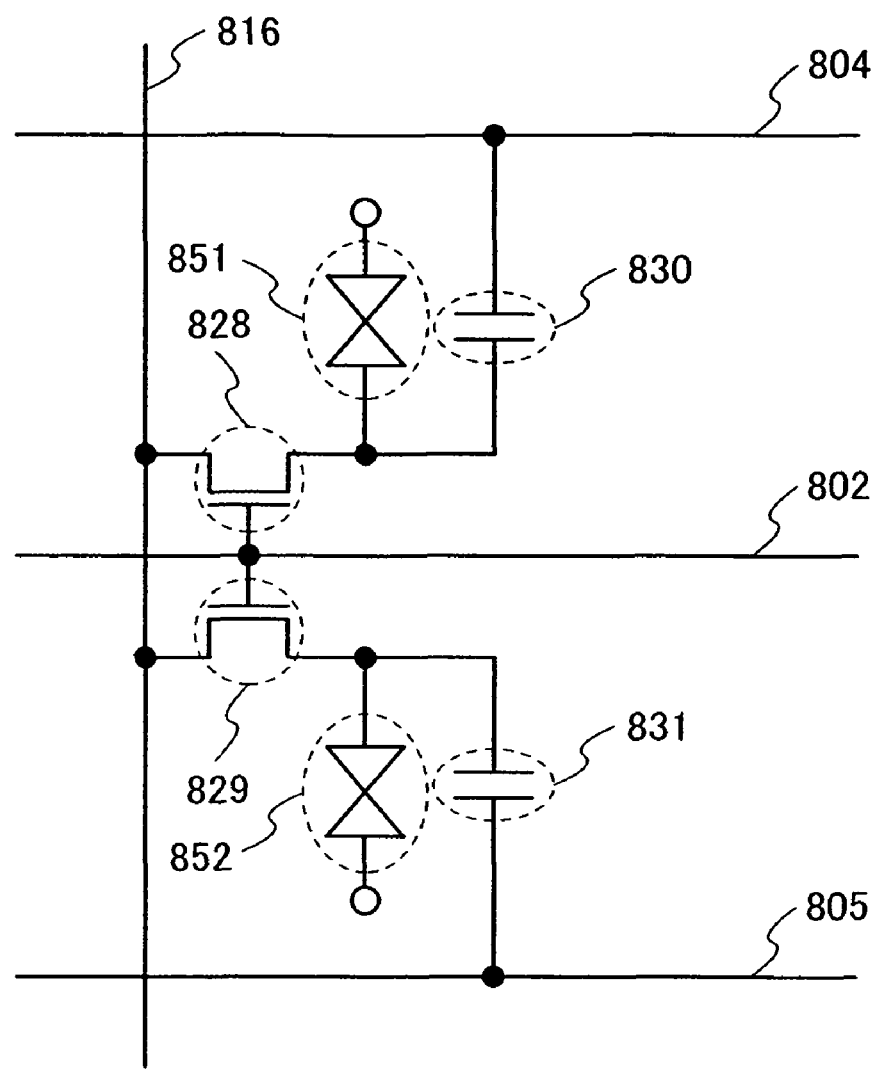
FIG. 11 is a circuit diagram of a display device of the present invention.

FIG. 11 illustrates an equivalent circuit of the pixel structure. Both the TFT 828 and the TFT 829 are connected to the gate wiring 802 and the wiring 816. In this case, when potentials of the capacitor wirings 804 and 805 are different from each other, operations of liquid crystal elements 851 and 852 can vary. That is, alignment of the liquid crystal is precisely controlled and a viewing angle is increased by controlling potentials of the capacitor wiring 804 and a capacitor wiring 805 individually.

When voltage is applied to the pixel electrode 824 provided with the slit 825, electric field distortion (an oblique electric field) is generated near the slit 825. The slit 825 and the projection 844 on the counter substrate 801 side are alternately arranged in an engaging manner and thus, an oblique electric field is generated, so that a direction of alignment of the liquid crystal varies depending on the location. Thus, a viewing angle of the liquid crystal display panel is increased.

Next, another VA liquid crystal display device, which is different from the above-described device, is described with reference to FIG. 12, FIG. 13, FIG. 14, and FIG. 15.

Figure 12:
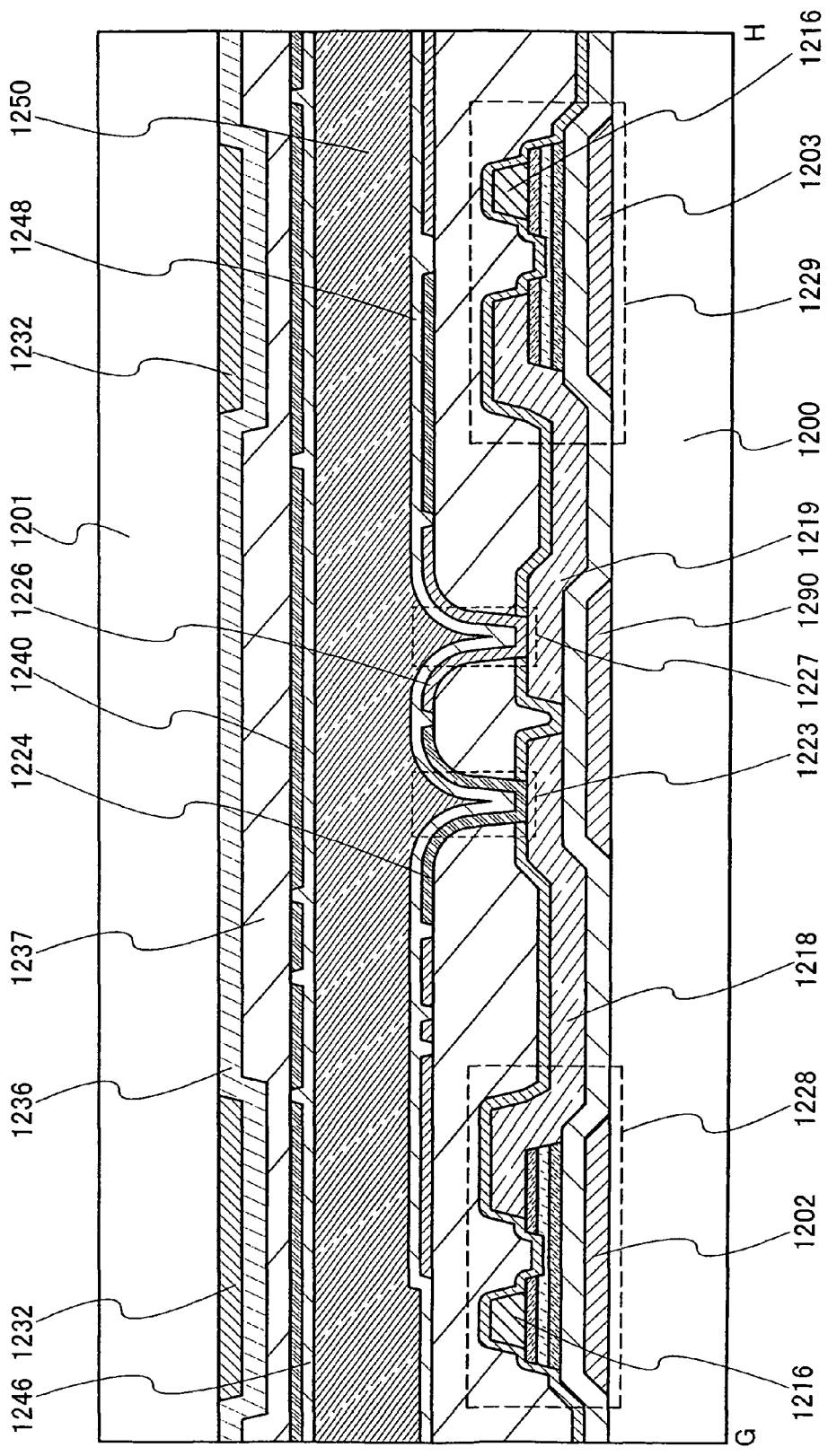
FIG. 12 is a cross-sectional view of a display device of the present invention.
Figure 13:
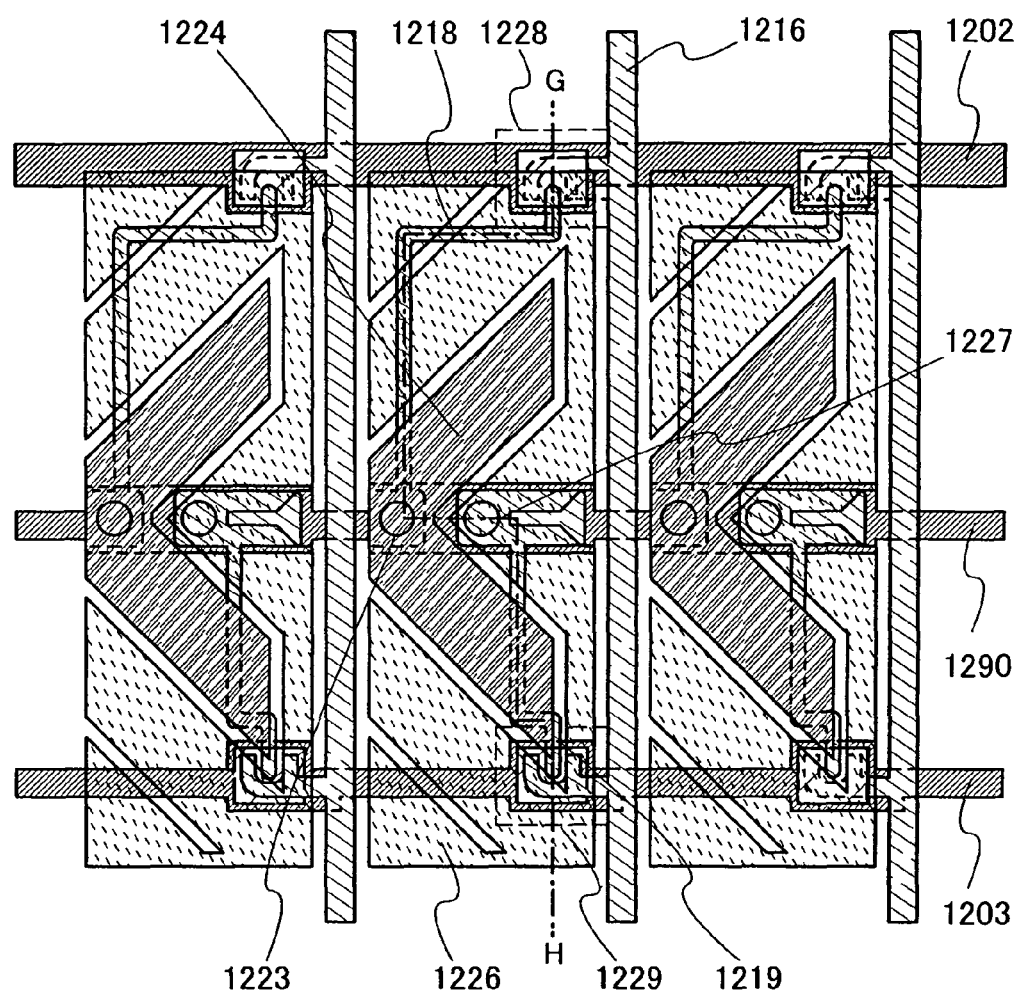
FIG. 13 is a plan view of a display device of the present invention.
Figure 14:
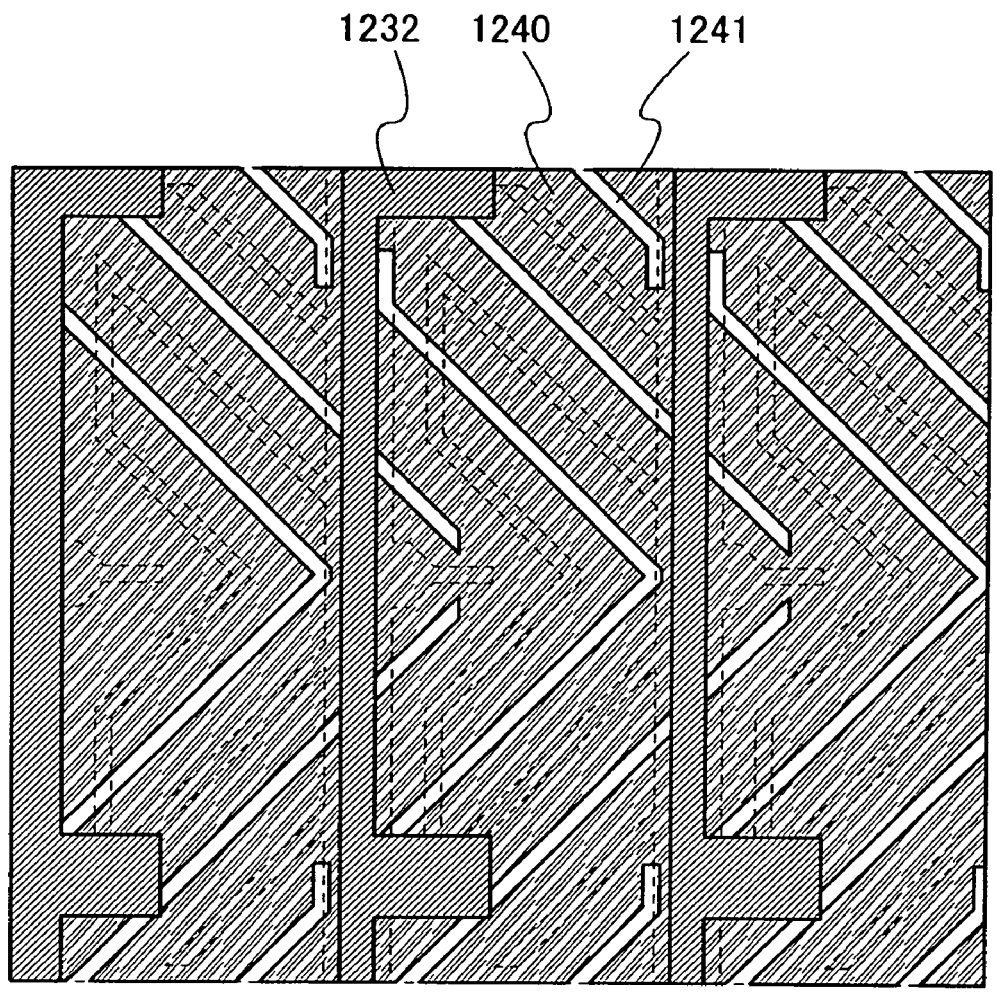
FIG. 14 is a plan view of a display device of the present invention.

FIG. 12 and FIG. 13 each show an example of the VA liquid crystal display device. FIG. 12 illustrates a cross-sectional view. FIG. 13 is a plan view of a side of a substrate on which the pixel electrode is formed. FIG. 14 is a plan view of a side of a substrate on which the counter electrode is formed. Note that FIG. 12 corresponds to a cross-sectional structure along a line G-H in FIG. 13. Hereinafter, description is made with reference to these drawings.

In the liquid crystal display device described here, a plurality of pixel electrodes are included in one pixel, and a TFT is connected to each pixel electrode. Each TFT is driven by a different gate signal. That is, a pixel with multiplied domain has a structure in which signals applied to the respective pixel electrodes are individually controlled.

A structure over a substrate 1200 is described. A pixel electrode 1224 is connected to a wiring 1218 of a TFT 1228 via a contact hole 1223. A pixel electrode 1226 is connected to a wiring 1219 of a TFT 1229 via a contact hole 1227. An orientation film 1248 is formed over the pixel electrode 1224 and the pixel electrode 1226. A gate wiring 1202 of the TFT 1228 and a gate wiring 1203 of the TFT 1229 are separated so that different gate signals can be applied. In contrast, a wiring 1216 functioning as a data line is used in common for the TFTs 1228 and 1229. As each of the TFTs 1228 and 1229, the thin film transistor described in Embodiment Mode 1 or 2 can be used as appropriate. In addition, a capacitor wiring 1290 is formed in the same layer of the gate wiring 1202 and the gate wiring 1203.

The pixel electrodes 1224 and 1226 have different shapes and are separated by the slit. The pixel electrode 1226 is formed so as to surround the external side of the pixel electrode 1224 which is spread in a V shape. Timing of voltage application is made to vary between the pixel electrodes 1224 and 1226 by the TFTs 1228 and 1229 in order to control alignment of a liquid crystal.

Figure 15:
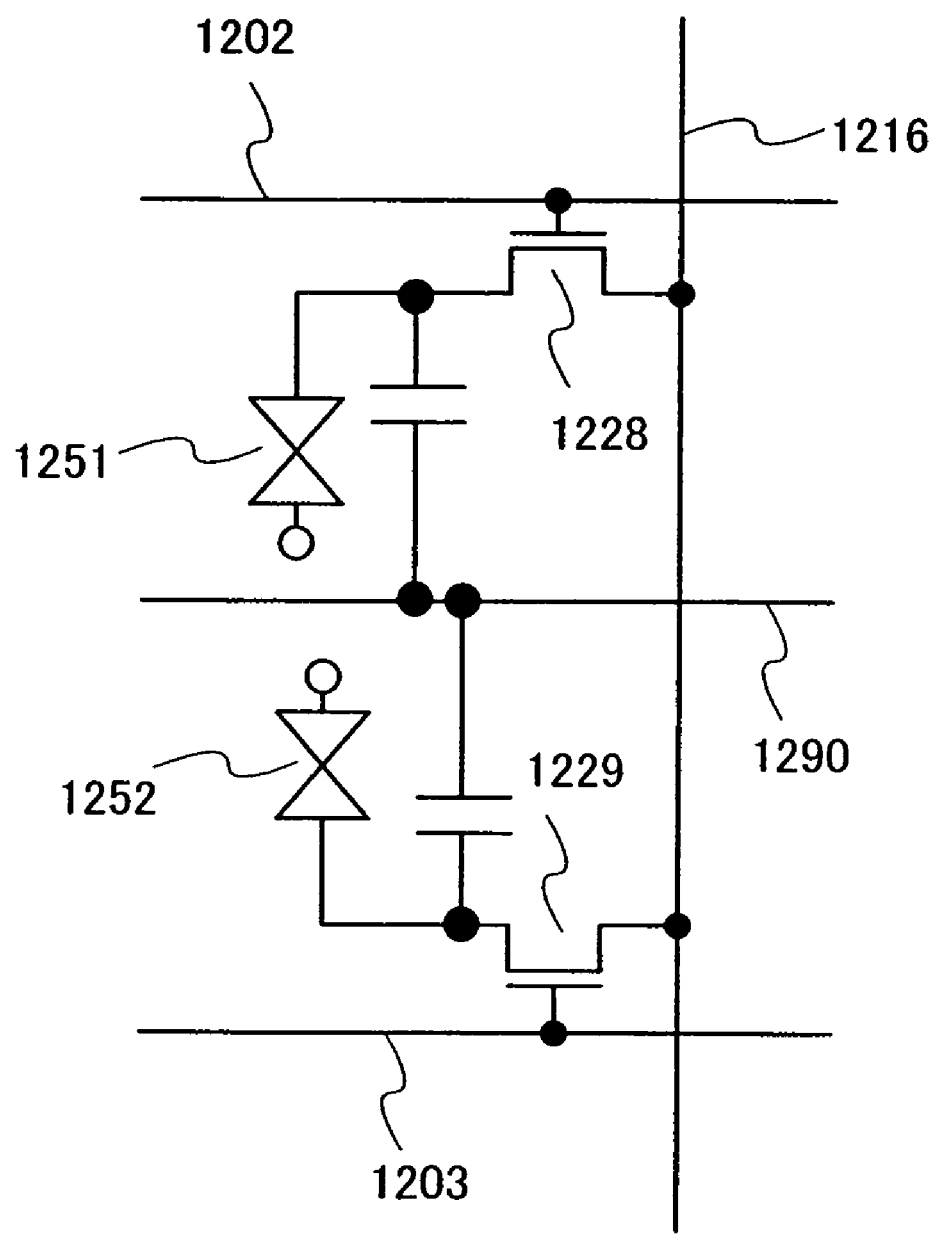
FIG. 15 is a circuit diagram of a display device of the present invention.

FIG. 15 illustrates an equivalent circuit of this pixel structure. The TFT 1228 is connected to the gate wiring 1202. The TFT 1229 is connected to the gate wiring 1203. When different gate signals are supplied to the gate wirings 1202 and 1203, operation timings of the TFTs 1228 and 1229 can vary.

A counter substrate 1201 is provided with a light shielding film 1232, a colored film 1236, a counter electrode 1240, and an orientation film 1246. Moreover, a planarization film 1237 is formed between the colored film 1236 and the counter electrode 1240 to prevent alignment disorder of a liquid crystal. A slit 1241 is formed in the counter electrode 1240, which is used in common between different pixels. A liquid crystal element is formed by overlapping of the pixel electrode 1224, a liquid crystal layer 1250, and the counter electrode 1240. Further, a liquid crystal element is formed by overlapping of the pixel electrode 1226, the liquid crystal layer 1250, and the counter electrode 1240.

The slit 1241 and the slit of the pixel electrode 1224 and 1226 side are alternately arranged in an engaging manner and thus, an oblique electric field is generated, so that a direction of alignment of the liquid crystal varies depending on location (see FIG. 14). Thus, a viewing angle of the liquid crystal display panel is increased.

Next, a horizontal electric field mode of liquid crystal display device is described. The horizontal electric field mode is a method in which an electric field is horizontally applied to liquid crystal molecules to drive liquid crystal, whereby a gray scale is expressed. By this method, a viewing angle can be increased to approximately 180 degrees. Hereinafter, a liquid crystal display device employing the horizontal electric field mode is described.

Figure 16:
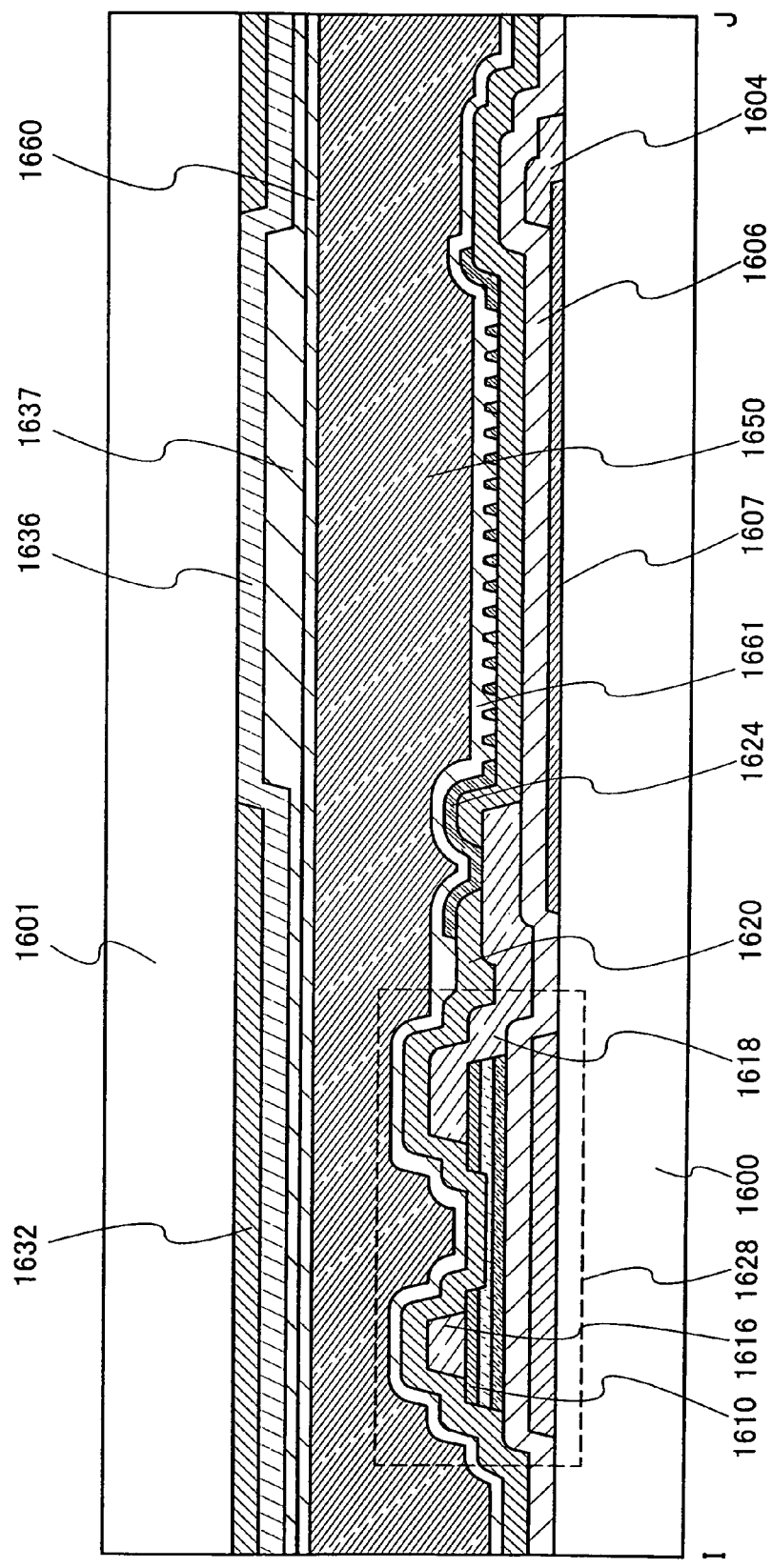
FIG. 16 is a cross-sectional view of a display device of the present invention.

FIG. 16 illustrates a state in which a substrate 1600 provided with a TFT 1628 and a second pixel electrode 1624 connected to the TFT 1628 overlaps with a counter substrate 1601, and liquid crystal is injected. The counter substrate 1601 is provided with a light shielding film 1632, the colored film 1636, the planarization film 1637, and an orientation film 1660. Since a first pixel electrode 1607 and the second pixel electrode 1624 are provided on the substrate 1600 side, an electrode is not provided on the counter substrate 1601 side. An orientation film 1661 is formed over the second pixel electrode 1624. A liquid crystal layer 1650 is formed between the substrate 1600 and the counter substrate 1601.

The first pixel electrode 1607, a capacitor wiring 1604 connected to the first pixel electrode 1607, and the TFT 1628 are formed over the substrate 1600. The first pixel electrode 1607 can be formed using a material similar to the pixel electrode described in Embodiment Mode 1. The first pixel electrode 1607 is formed in a shape which roughly fits a pixel shape. Note that a gate insulating film 1606 is formed over the first pixel electrode 1607 and the capacitor wiring 1604.

Wirings 1616 and 1618 of the TFT 1628 are formed over the gate insulating film 1606. The wiring 1616 serves as a data line as well as a wiring through which a video signal is transmitted in a liquid crystal display panel, and is connected to a source region 1610 and serves as one of a source electrode and a drain electrode. The wiring 1618 serves as the other of the source electrode and the drain electrode, and serve as a wiring which connects the TFT 1628 and the second pixel electrode 1624.

An insulating film 1620 is formed over the wirings 1616 and 1618. Over the insulating film 1620, the second pixel electrode 1624 connected to the wiring 1618 via a contact hole formed in the insulating film 1620 is formed. The second pixel electrode 1624 is formed using a material similar to the pixel electrode described in Embodiment Mode 1.

In such a manner, the TFT 1628 and the second pixel electrode 1624 connected to the TFT 1628 are formed over the substrate 1600. Note that a storage capacitor is formed using the first pixel electrode 1607, the second pixel electrode 1624, the gate insulating film 1606, and the insulating film 1620.

Figure 17:
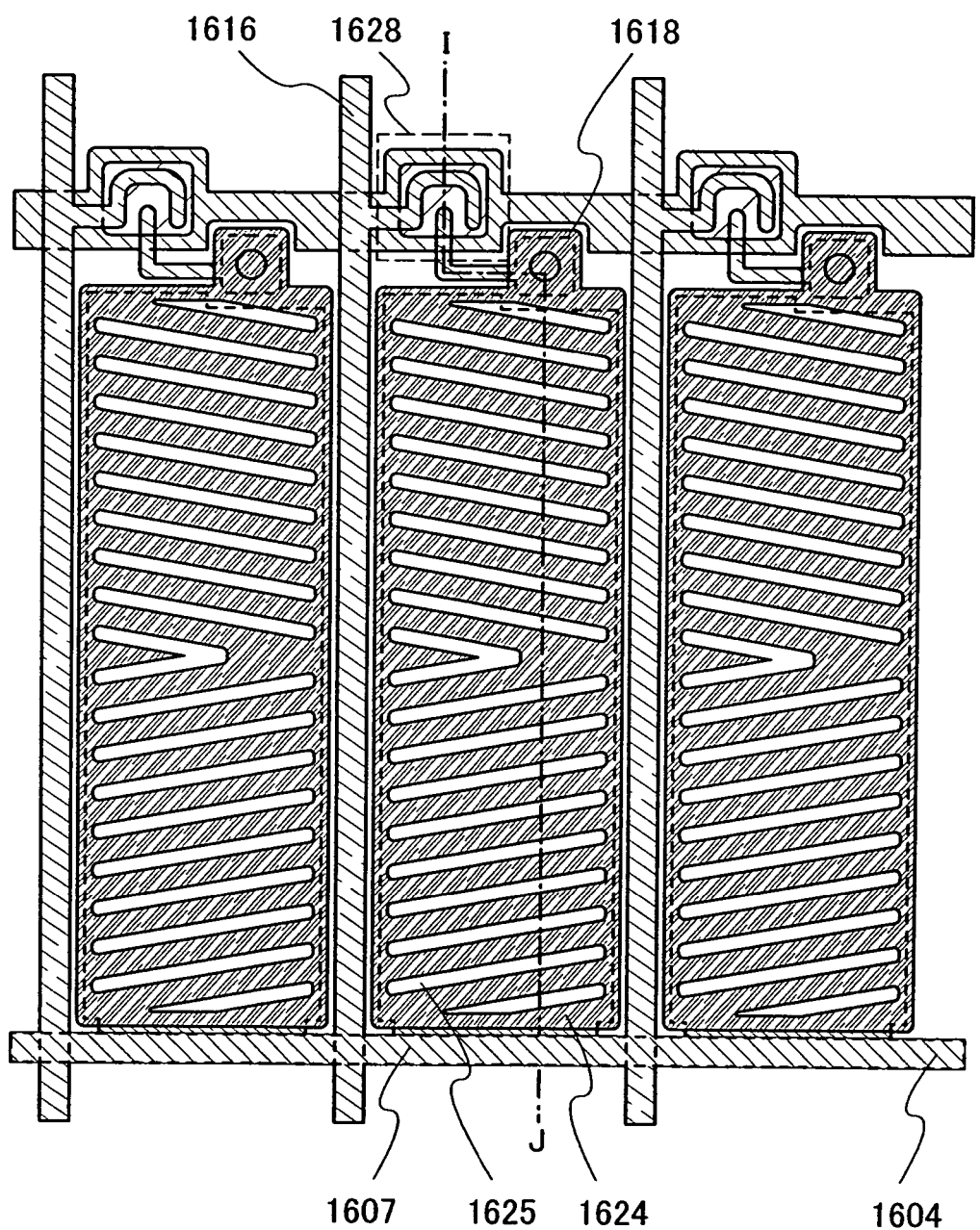
FIG. 17 is a plan view of a display device of the present invention.

FIG. 17 is a plan view illustrating a structure of the pixel electrode or the like. Note that FIG. 16 is a cross-sectional view along a line I-J in FIG. 17. The second pixel electrode 1624 is provided with a slit 1625. The slit 1625 is for controlling alignment of the liquid crystal. In this case, an electric field is generated between the first pixel electrode 1607 and the second pixel electrode 1624. The thickness of the gate insulating film 1606 formed between the first pixel electrode 1607 and the second pixel electrode 1624 is thin enough compared to that of the liquid crystal layer. Accordingly, an electric field is generated substantially in parallel (in a horizontal direction) to the substrate 1600. The liquid crystal molecules are horizontally rotated using the electric field. In this case, since the liquid crystal molecules are parallel to the substrate, a problem of reduction in contrast or the like by change viewing angle hardly occurs, and a viewing angle is increased. Further, since both the first pixel electrode 1607 and the second pixel electrode 1624 are light-transmitting electrodes, an aperture ratio can be increased.

Next, another example of a horizontal electric field mode of liquid crystal display device is described.

Figure 18:
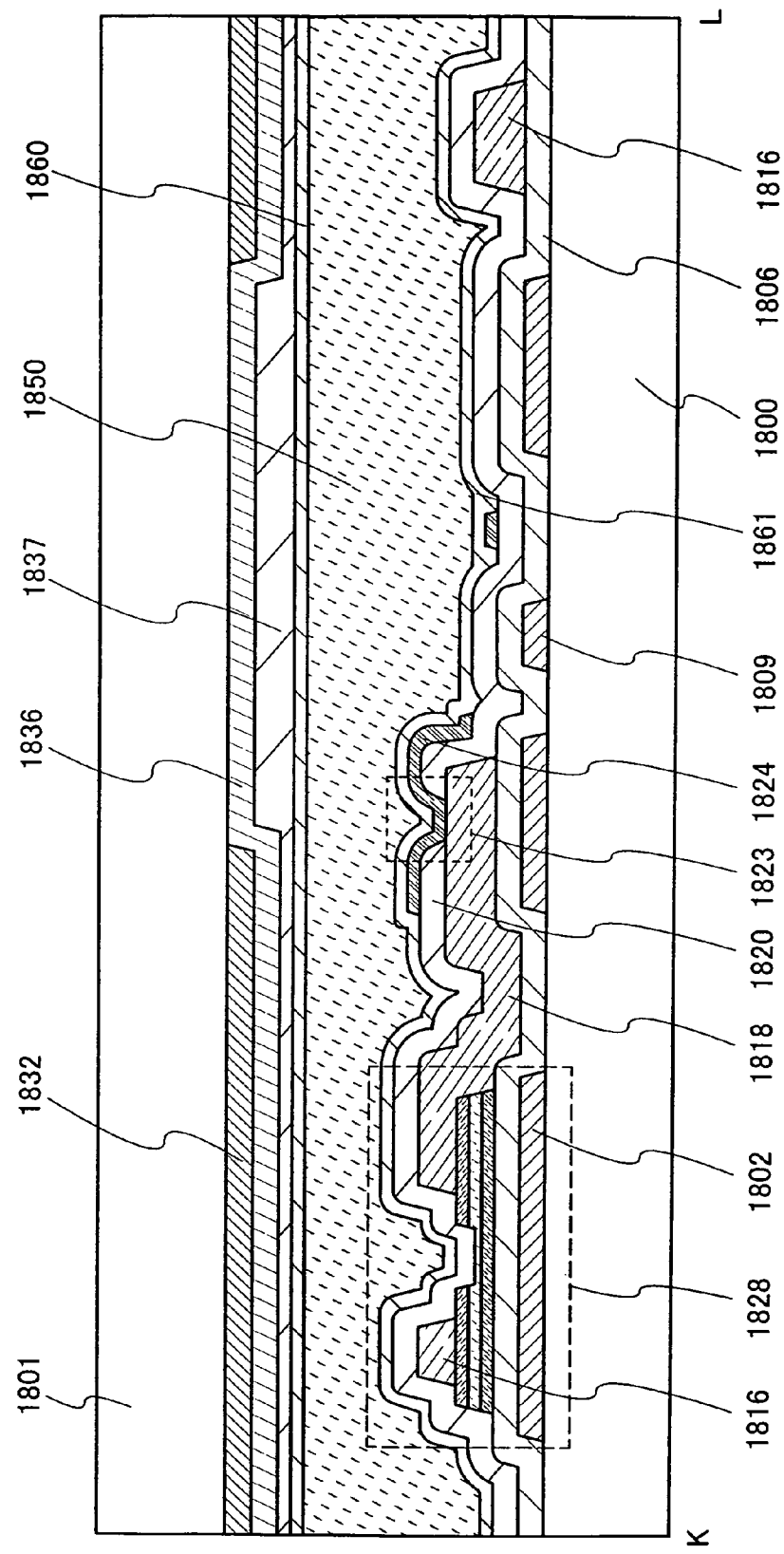
FIG. 18 is a cross-sectional view of a display device of the present invention.
Figure 19:
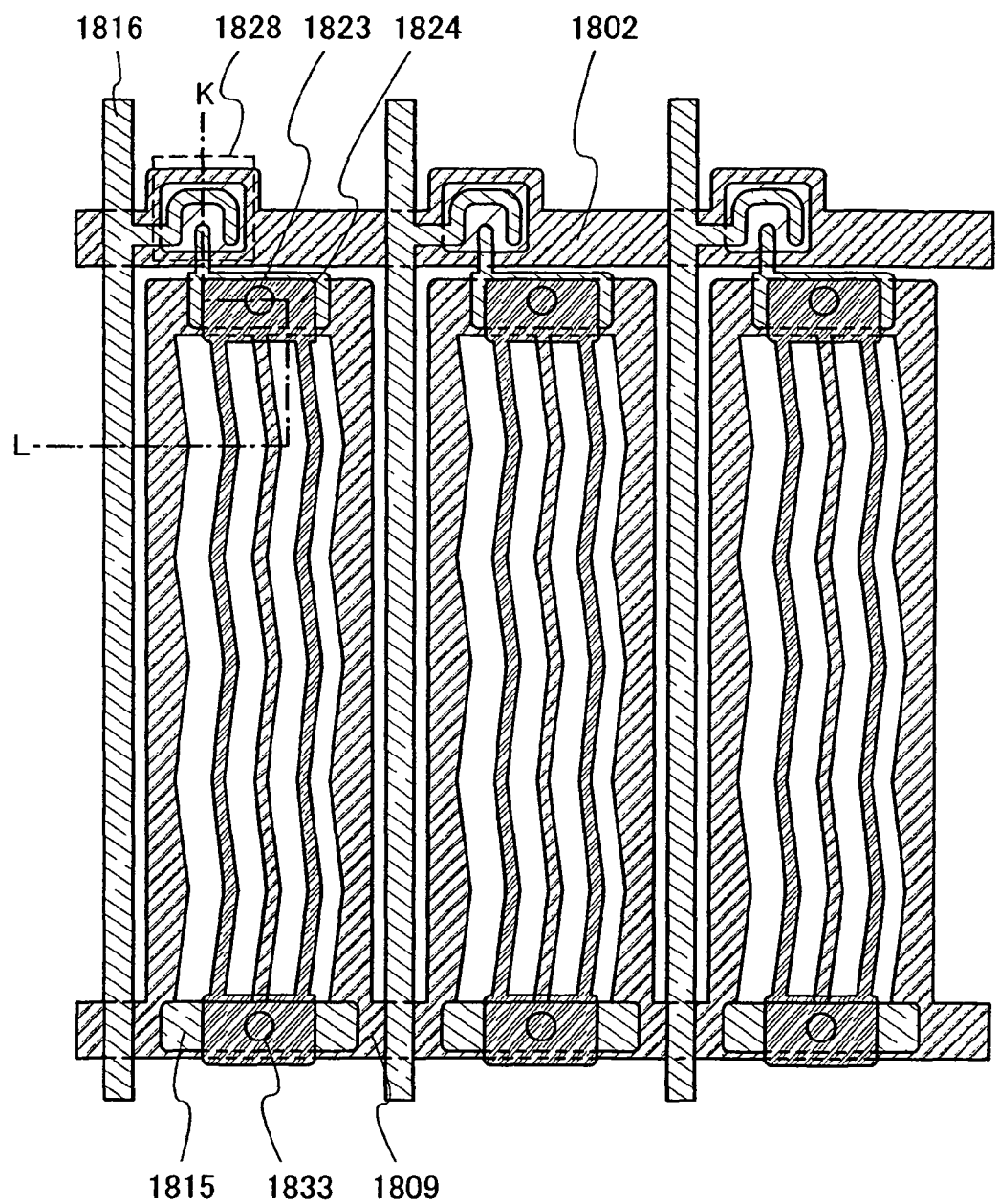
FIG. 19 is a plan view of a display device of the present invention.

FIG. 18 and FIG. 19 each show another structure of liquid crystal display device of the horizontal electric field mode. FIG. 18 is a cross-sectional view. FIG. 19 is a plan view. FIG. 18 corresponds to a cross-sectional along a line I-J in FIG. 19. Hereinafter, description is made with reference to these drawings.

FIG. 18 illustrates a state in which a substrate 1800 provided with a TFT 1828 and a second pixel electrode 1824 connected to the TFT 1828 overlaps with a counter substrate 1801, and liquid crystal is injected. The counter substrate 1801 is provided with a light shielding film 1832, a colored film 1836, a planarization film 1837, and an orientation film 1860. Since the first pixel electrode (a common potential line 1809) and the second pixel electrode 1824 are provided on the substrate 1800 side, an electrode is not necessarily provided on the counter substrate 1801 side. An orientation film 1861 is formed over the second pixel electrode 1824. A liquid crystal layer 1850 is formed between the substrate 1800 and the counter substrate 1801.

The common potential line 1809 and the TFT 1828 are formed over the substrate 1800. The common potential line 1809 can be formed at the same time as a gate wiring 1802 of the TFT 1828. Here, the first pixel electrode is defined as the common potential line 1809. Therefore, the common potential line 1809 is formed in a shape which roughly fits a pixel shape.

Wirings 1816 and 1818 of the TFT 1828 are formed over a gate insulating film 1806. The wiring 1816 serves as a data line as well as a wiring through which a video signal is transmitted in a liquid crystal display panel, and is connected to a source region or a drain region and serves as one of a source electrode and a drain electrode. The wiring 1818 serves as the other of the source electrode and the drain electrode, and serve as a wiring which connects the second pixel electrode 1824.

A insulating film 1820 is formed over the wirings 1816 and 1818. The second pixel electrode 1824 is formed over the insulating film 1820. The second pixel electrode 1824 is connected to the wiring 1818 via a contact hole 1823 formed in the insulating film 1820. The second pixel electrode 1824 is formed using a material similar to the pixel electrode described in Embodiment Mode 1. Note that as shown in FIG. 19, the first pixel electrode (the common potential line 1809) and the second pixel electrode 1824 are formed so as to generate a horizontal electric field therebetween. Moreover, the slit portion of the second pixel electrode 1824 and an electrode portion of the first pixel electrode (the common potential line 1809) are formed in engaged manner with each other.

When a potential difference is generated between the first pixel electrode (the common potential line 1809) and the second pixel electrode 1824, an electric field is generated between the pixel the first electrode (the common potential line 1809) and the second pixel electrode 1824. The liquid crystal molecules are horizontally rotated using the electric field. In this case, since the liquid crystal molecules are parallel to the substrate, a problem of reduction in contrast or the like by change viewing angle hardly occurs, and a viewing angle is increased.

Note that a storage capacitor is formed by providing the gate insulating film 1806 between the first pixel electrode (the common potential line 1809) and a capacitor electrode 1815. The capacitor electrode 1815 and the pixel electrode 1824 are connected via a contact hole 1833.

Next, a liquid crystal display device of TN mode is described.

Figure 20:
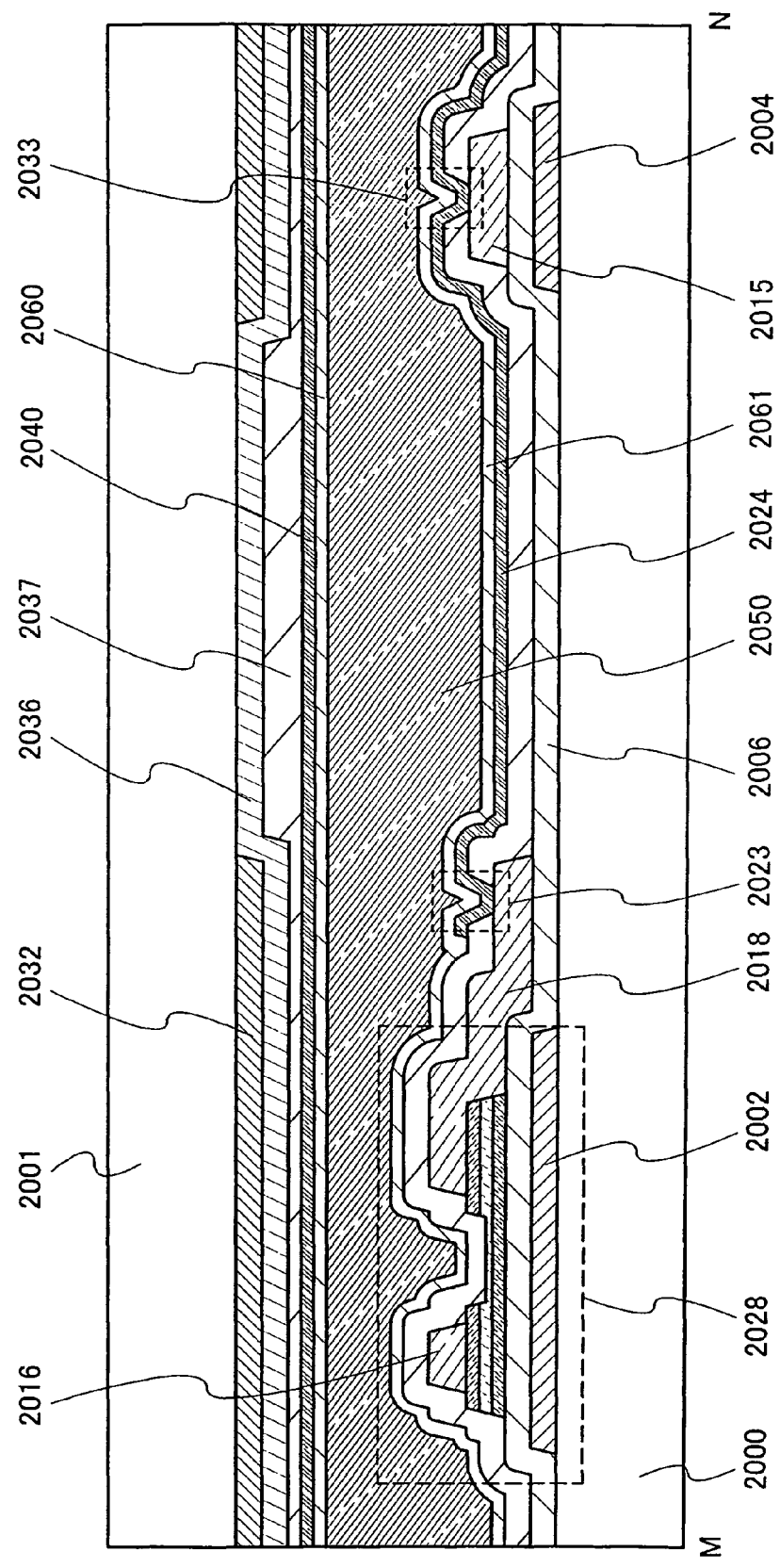
FIG. 20 is a cross-sectional view of a display device of the present invention.
Figure 21:
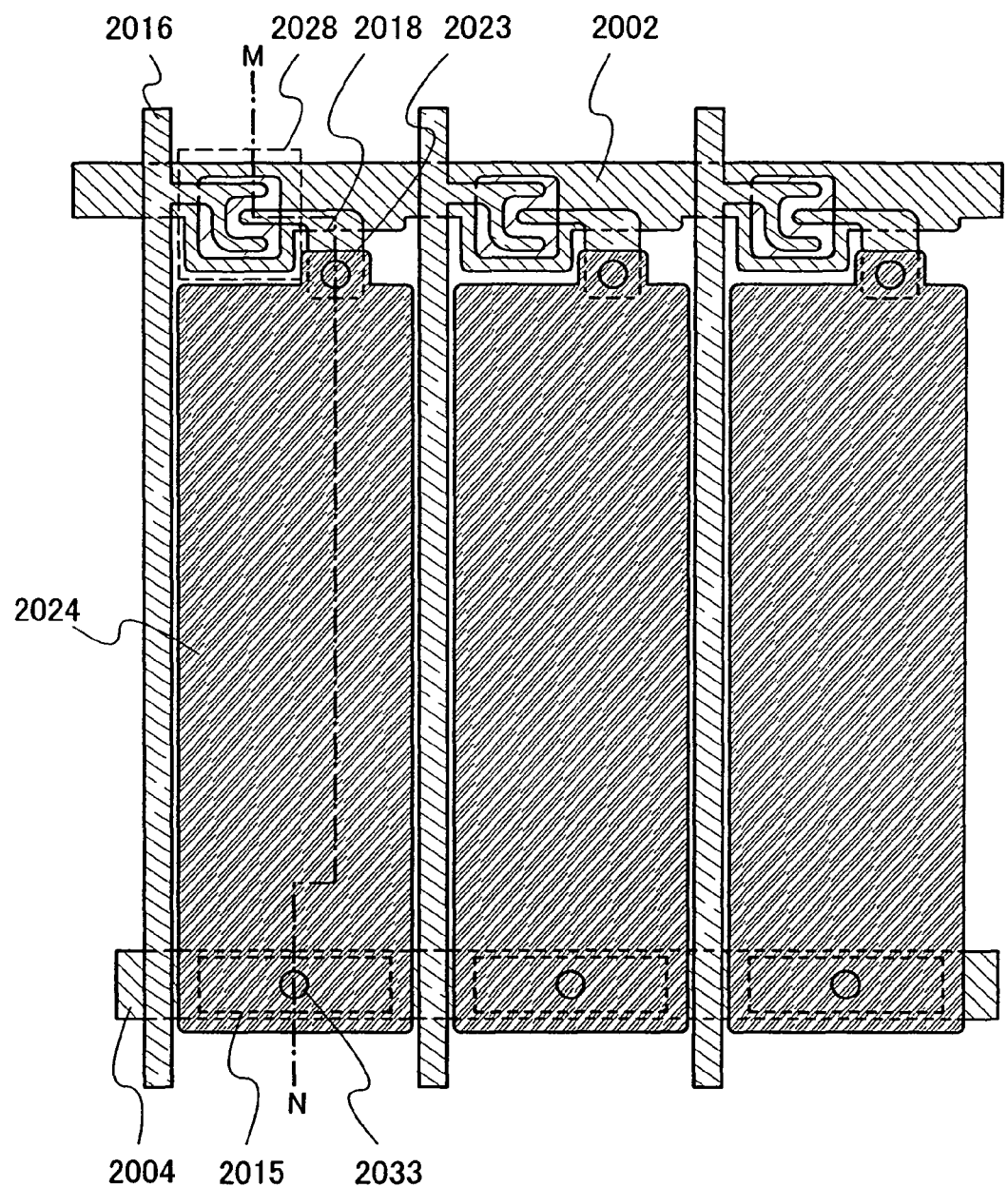
FIG. 21 is a plan view of a display device of the present invention.

FIG. 20 and FIG. 21 each show a pixel structure of a TN liquid crystal display device. FIG. 20 is a cross-sectional. FIG. 21 is a plan view. FIG. 20 shows a cross-sectional along a line M-N in FIG. 21. Hereinafter, description is made with reference to these drawings.

A pixel electrode 2024 is connected to a TFT 2028 by a wiring 2018 via a contact hole 2023. A wiring 2016 serving as a data line is connected to the TFT 2028. As the TFT 2028, any of the TFTs described in Embodiment Modes 1 and 2 can be used.

The pixel electrode 2024 is formed using a material of the pixel electrode described in Embodiment Mode 1.

A counter substrate 2001 is provided with a light shielding film 2032, a colored film 2036, a counter electrode 2040 and an orientation film 2060. A planarization film 2037 is formed between the colored film 2036 and the counter electrode 2040 to prevent alignment disorder of liquid crystal. A liquid crystal layer 2050 is formed between an orientation film 2061 over the pixel electrode 2024 and the orientation film 2060 over the counter electrode 2040.

A substrate 2000 may be provided with a colored film, a shielding film (a black matrix) for preventing disclination, or the like. Further, a polarizing plate is attached to a surface of the substrate 2000, which is opposite to a surface on which the TFT 2028 is formed. Moreover, a polarizing plate is attached to a surface of the counter substrate 2001, which is opposite to a surface on which the counter electrode 2040 is formed. The counter electrode 2040 can be formed using a similar material of the pixel electrode described in Embodiment Mode 1.

Note that a storage capacitor is formed by providing a capacitor wiring 2004 formed in the same layer with a gate electrode 2002 and a gate insulating film 2006, and a capacitor electrode 2015. The capacitor electrode 2015 and the pixel electrode 2024 are connected via a contact hole 2033.

Through the above-described steps, various modes of liquid crystal display device in which a microcrystalline semiconductor is used as a channel formation region of a pixel transistor can be provided.

Since the liquid crystal display device of the present invention employ thin film transistors with little off-current and little variation, the aperture ratio can be improved. Therefore, luminance increases, whereby an excellent image can be displayed. Further, luminance of backlight can be reduced, which brings an effect of lifetime expectancy of the backlight.

This embodiment mode can be combined with Embodiment Modes 1 and 2 as appropriate.

Embodiment Mode 4

In this embodiment mode, electronic devices in which the liquid crystal display device of the present invention is used is described with reference to FIGS. 22A to 22H.

For electronic devices manufactured by using the semiconductor device of the present invention, video cameras; digital cameras; goggles-type displays (head-mounted displays); navigation systems; audio playback devices (car audio components and the like); computers; game machines; portable information terminals (mobile computers, cellular phones, portable game machines, electronic book readers, and the like); image playback devices provided with storage media (specifically, devices that can play storage media such as digital versatile discs (DVDs) or the like and that are equipped with a display device by which the images can be displayed); and the like can be given.

Figure 22A:
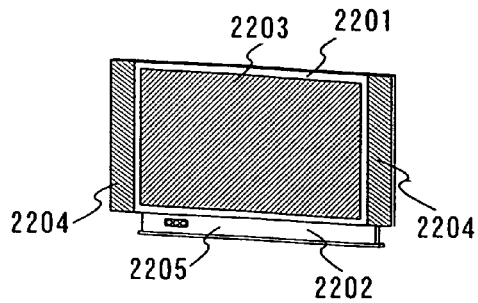
FIGS. 22A to 22H are views of electronic devices using a display device of the present invention.

FIG. 22A is a view of a television set or monitor of a personal computer. The television set or monitor of a personal computer includes a housing 2201, a support stand 2202, a display portion 2203, speaker portions 2204, video input terminals 2205, and the like. The liquid crystal display device of the present invention is used in the display portion 2203. By the present invention, a television set or monitor of a personal computer of which aperture ratio and luminance are improved can be provided.

Figure 22B:
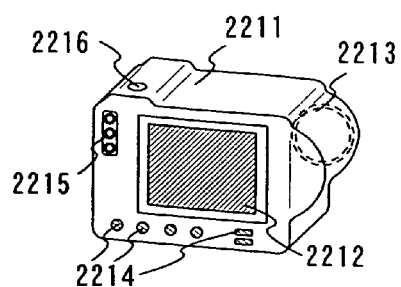

FIG. 22B is a view of a digital camera. On the front side part of a main body 2211, an image receiver 2213 is provided, and on the top side part of the main body 2211, a shutter button 2216 is provided. Furthermore, on the back side part of the main body 2211, a display portion 2212, operation keys 2214, and an external connection port 2215 are provided. The liquid crystal display device of the present invention is used in the display portion 2212. By the present invention, a digital camera of which aperture ratio and luminance are improved can be provided.

Figure 22C:
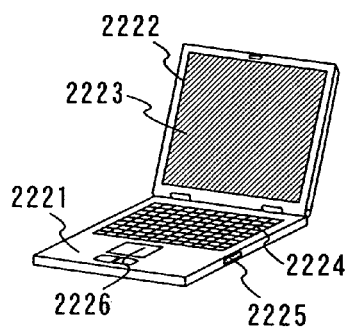

FIG. 22C is a view of a notebook computer. In a main body 2221, a keyboard 2224, an external connection port 2225, and a pointing device 2226 are provided. Furthermore, a housing 2222 that has a display portion 2223 is attached to the main body 2221. The liquid crystal display device of the present invention is used in the display portion 2223. By the present invention, a notebook computer of which aperture ratio and luminance are improved can be provided.

Figure 22D:
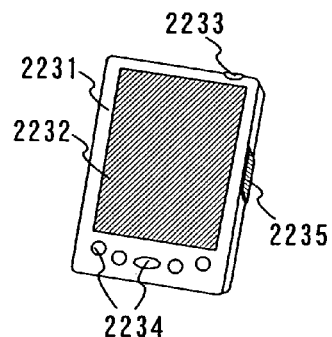

FIG. 22D is a view of a mobile computer that includes a main body 2231, a display portion 2232, a switch 2233, operation keys 2234, an infrared port 2235, and the like. Furthermore, an active matrix display device is provided in the display portion 2232. The liquid crystal display device of the present invention is used in the display portion 2232. By the present invention, a mobile computer of which aperture ratio and luminance are improved can be provided.

Figure 22E:
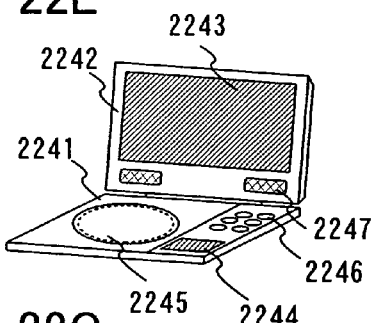

FIG. 22E is a view of an image playback device. In a main body 2241, a display portion B 2244, a storage media reader 2245, and operation keys 2246 are provided. Furthermore, a housing 2242 that has speaker portions 2247 and a display portion A 2243 is attached to the main body 2241. The liquid crystal display device of the present invention is used in each of the display portion A 2243 and the display portion B 2244. By the present invention, an image playback device of which aperture ratio and luminance are improved can be provided.

Figure 22F:
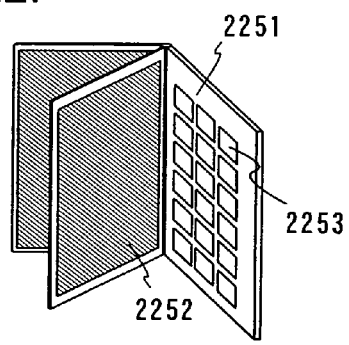

FIG. 22F is a view of an electronic book reader. In a main body 2251, operation keys 2253 are provided. Furthermore, a plurality of display portions 2252 is attached to the main body 2251. The liquid crystal display device of the present invention is used in each of the display portions 2252. By the present invention, an electronic book reader of which aperture ratio and luminance are improved can be provided.

Figure 22G:
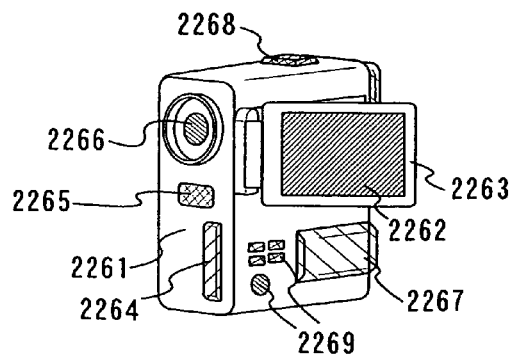

FIG. 22G is a view of a video camera. In a main body 2261, an external connection port 2264, a remote control receiver 2265, an image receiver 2266, a battery 2267, an audio input portion 2268, operation keys 2269 are provided. Furthermore, a housing 2263 that has a display portion 2262 is attached to the main body 2261. The liquid crystal display device of the present invention is used in the display portion 2262. By the present invention, a video camera of which aperture ratio and luminance are improved can be provided.

Figure 22H:
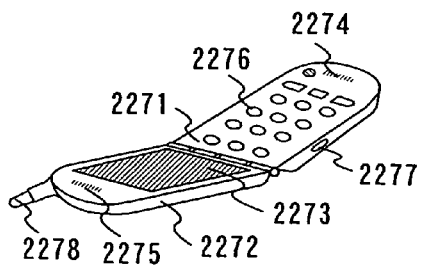
Figure 23:
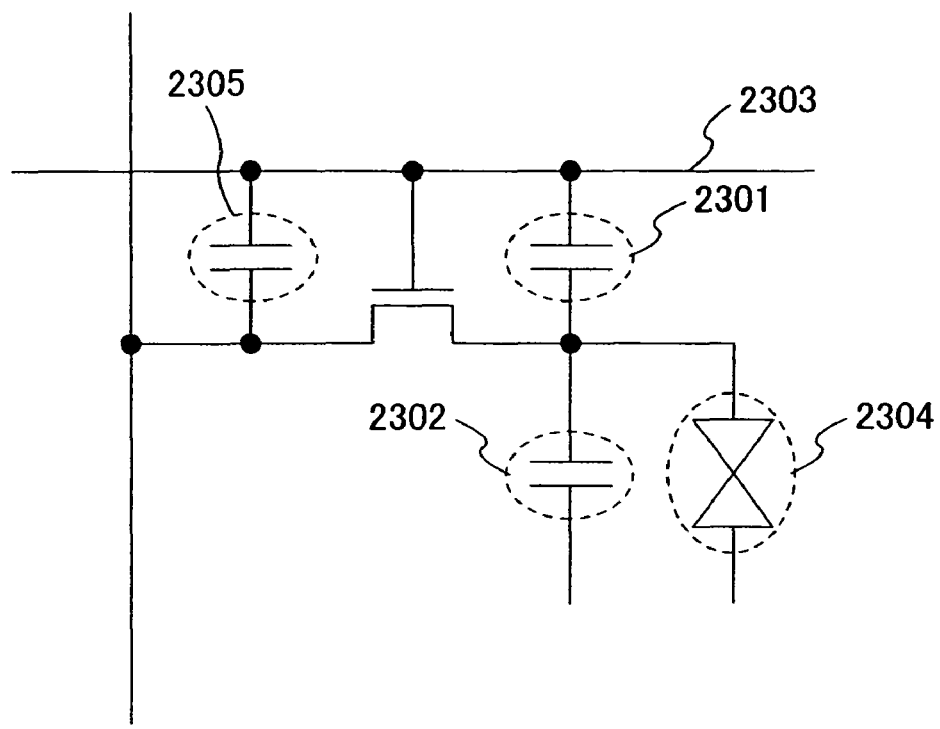
FIG. 23 is a circuit diagram of a conventional display device.

FIG. 22H is a view of a cellular phone that includes a main body 2271, a housing 2272, a display portion 2273, an audio input portion 2274, an audio output portion 2275, operation keys 2276, an external connection port 2277, an antenna 2278, and the like. The liquid crystal display device of the present invention is used in the display portion 2273. By the present invention, a cellular phone of which aperture ratio and luminance are improved can be provided.

As described above, the range of application of the present invention is extremely wide, and the present invention can be used in electronic devices of various fields. It is to be noted that this embodiment mode can be used in combination with Embodiment Mode 1 through Embodiment Mode 3, as appropriate.

This application is based on Japanese Patent Application serial No. 2007-196489 filed with the Japan Patent Office on Jul. 27, 2007, the entire contents of which are hereby incorporated by reference.

What is claimed is:

1. A liquid crystal display device comprising:
    a substrate having an insulating surface;
    a transistor formed over the substrate; and
    a pixel electrode electrically connected to the transistor,
    wherein the transistor includes:
        a gate electrode;
        a gate insulating layer over the gate electrode;
        a semiconductor layer having a microcrystalline structure over the gate electrode with the gate insulating layer interposed therebetween;
        a buffer layer comprising an amorphous semiconductor, the buffer layer over the semiconductor layer having the microcrystalline structure;
        a source region over a first region of the buffer layer; and
        a drain region over a second region of the buffer layer,
    wherein the buffer layer comprises a groove between the first region and the second region,
    wherein the semiconductor layer includes a channel formation region,
    wherein a channel width W of the transistor and a channel length L of the transistor satisfy a relation of $0.1 \leq W/L \leq 1.7$, and
    wherein a length of the gate electrode is larger than a length of the semiconductor layer in a direction of the channel length.

2. An electronic device comprising a liquid crystal display device according to claim 1.

3. The liquid crystal display device according to claim 1, further comprising a counter substrate,
    wherein the counter substrate comprises a light shielding film over the counter substrate, a first colored film over the light shielding film, a second colored film over the first colored film, a third colored film over the second colored film, a counter electrode over the third colored film, and a spacer over the counter electrode, and
    wherein the substrate overlaps with the counter substrate.

4. The liquid crystal display device according to claim 1, further comprising:
    a first conductive layer over the source region;
    a second conductive layer over the drain region; and
    a first insulating layer over the first conductive layer and the second conductive layer,
    wherein a top surface of the source region is in contact with the first conductive layer and the first insulating layer, and
    wherein a top surface of the drain region is in contact with the second conductive layer and the first insulating layer.

5. The liquid crystal display device according to claim 1, further comprising:
a first conductive layer over the source region; and
a second conductive layer over the drain region,
wherein the first conductive layer is in contact with at least a top surface of the source region, a side surface of the buffer layer and a side surface of the semiconductor layer.

6. A liquid crystal display device comprising:
a substrate having an insulating surface;
a transistor formed over the substrate; and
a pixel electrode electrically connected to the transistor,
wherein the transistor includes:
  a gate electrode;
  a gate insulating layer over the gate electrode;
  a semiconductor layer having a microcrystalline structure over the gate electrode with the gate insulating layer interposed therebetween;
  a buffer layer comprising an amorphous semiconductor, the buffer layer over the semiconductor layer having the microcrystalline structure;
  a source region over a first region of the buffer layer; and
  a drain region over a second region of the buffer layer;
wherein the buffer layer comprises a groove between the first region and the second region,
wherein a channel width W of the transistor is equal to or greater than 1 µm and equal to or less than 5 µm, and
wherein a length of the gate electrode is larger than a length of the semiconductor layer in a direction of a channel length.

7. An electronic device comprising a liquid crystal display device according to claim 6.

8. The liquid crystal display device according to claim 6, further comprising a counter substrate,
wherein the counter substrate comprises a light shielding film over the counter substrate, a first colored film over the light shielding film, a second colored film over the first colored film, a third colored film over the second colored film, a counter electrode over the third colored film, and a spacer over the counter electrode, and
wherein the substrate overlaps with the counter substrate.

9. The liquid crystal display device according to claim 6, further comprising:
a first conductive layer over the source region;
a second conductive layer over the drain region; and
a first insulating layer over the first conductive layer and the second conductive layer,
wherein a top surface of the source region is in contact with the first conductive layer and the first insulating layer,
wherein a top surface of the drain region is in contact with the second conductive layer and the first insulating layer.

10. The liquid crystal display device according to claim 6, further comprising:
a first conductive layer over the source region; and
a second conductive layer over the drain region,
wherein the first conductive layer is in contact with at least a top surface of the source region, a side surface of the buffer layer and a side surface of the semiconductor layer.

11. A liquid crystal display device comprising:
a substrate having an insulating surface;
a transistor formed over the substrate; and
a pixel electrode electrically connected to the transistor,
wherein the transistor includes:
  a gate electrode;
  a gate insulating layer over the gate electrode;
  a semiconductor layer having a microcrystalline structure over the gate electrode with the gate insulating layer interposed therebetween;
  a buffer layer comprising an amorphous semiconductor, the buffer layer over the semiconductor layer having the microcrystalline structure;
  a source region over a first region of the buffer layer; and
  a drain region over a second region of the buffer layer;
wherein the buffer layer comprises a groove between the first region and the second region,
wherein the semiconductor layer includes a channel formation region,
wherein a channel width W of the transistor and a channel length L of the transistor satisfy a relation of $0.1 \leq W/L \leq 1.7$,
wherein the buffer layer is provided at least over the channel formation region, and
wherein a length of the gate electrode is larger than a length of the semiconductor layer in a direction of the channel length.

12. An electronic device comprising a liquid crystal display device according to claim 11.

13. The liquid crystal display device according to claim 11, further comprising a counter substrate,
wherein the counter substrate comprises a light shielding film over the counter substrate, a first colored film over the light shielding film, a second colored film over the first colored film, a third colored film over the second colored film, a counter electrode over the third colored film, and a spacer over the counter electrode, and
wherein the substrate overlaps with the counter substrate.

14. The liquid crystal display device according to claim 11, further comprising:
a first conductive layer over the source region;
a second conductive layer over the drain region; and
a first insulating layer over the first conductive layer and the second conductive layer,
wherein a top surface of the source region is in contact with the first conductive layer and the first insulating layer,
wherein a top surface of the drain region is in contact with the second conductive layer and the first insulating layer.

15. The liquid crystal display device according to claim 11, further comprising:
a first conductive layer over the source region; and
a second conductive layer over the drain region,
wherein the first conductive layer is in contact with at least a top surface of the source region, a side surface of the buffer layer and a side surface of the semiconductor layer.

16. A liquid crystal display device comprising:
a substrate having an insulating surface;
a transistor formed over the substrate; and
a pixel electrode electrically connected to the transistor,
wherein the transistor includes:
  a gate electrode;
  a gate insulating layer over the gate electrode;
  a semiconductor layer having a microcrystalline structure over the gate electrode with the gate insulating layer interposed therebetween;
  a buffer layer comprising an amorphous semiconductor, the buffer layer over the semiconductor layer having the microcrystalline structure;
  a source region over a first region of the buffer layer; and
  a drain region over a second region of the buffer layer;
wherein the buffer layer comprises a groove between the first region and the second region, wherein the semiconductor layer includes a channel formation region, wherein a channel width W of the transistor is equal to or greater than 1 μm and equal to or less than 5 μm, wherein the buffer layer is provided at least over the channel formation region, and wherein a length of the gate electrode is larger than a length of the semiconductor layer in a direction of a channel length.

17. An electronic device comprising a liquid crystal display device according to claim 16.

18. The liquid crystal display device according to claim 16, further comprising a counter substrate, wherein the counter substrate comprises a light shielding film over the counter substrate, a first colored film over the light shielding film, a second colored film over the first colored film, a third colored film over the second colored film, a counter electrode over the third colored film, and a spacer over the counter electrode, and wherein the substrate overlaps with the counter substrate.

19. The liquid crystal display device according to claim 16, further comprising:

a first conductive layer over the source region;

a second conductive layer over the drain region; and a first insulating layer over the first conductive layer and the second conductive layer, wherein a top surface of the source region is in contact with the first conductive layer and the first insulating layer, wherein a top surface of the drain region is in contact with the second conductive layer and the first insulating layer.

20. The liquid crystal display device according to claim 16, further comprising:

a first conductive layer over the source region; and a second conductive layer over the drain region, wherein the first conductive layer is in contact with at least a top surface of the source region, a side surface of the buffer layer and a side surface of the semiconductor layer.

* * * * *